United States Patent
Tran et al.

(10) Patent No.: US 10,541,494 B2
(45) Date of Patent: Jan. 21, 2020

(54) CONNECTOR FOR PROCESSOR PACKAGE

(71) Applicant: Intel Corporation, Santa Clara, CA (US)

(72) Inventors: Donald T. Tran, Phoenix, AZ (US); Thomas A. Boyd, North Plains, OR (US); Yong Wang, Chapel Hill, NC (US); Kevin J. Ceurter, Olympia, WA (US); Srikant Nekkanty, Chandler, AZ (US); Russell S. Aoki, Tacoma, WA (US); FeiFei Cheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/078,613

(22) PCT Filed: Mar. 31, 2016

(86) PCT No.: PCT/US2016/025230
§ 371 (c)(1),
(2) Date: Aug. 21, 2018

(87) PCT Pub. No.: WO2017/171790
PCT Pub. Date: Oct. 5, 2017

(65) Prior Publication Data
US 2019/0052016 A1    Feb. 14, 2019

(51) Int. Cl.
*H01R 13/639* (2006.01)
*H01L 23/32* (2006.01)
(Continued)

(52) U.S. Cl.
CPC ........... *H01R 13/639* (2013.01); *H01L 23/32* (2013.01); *H01R 12/716* (2013.01);
(Continued)

(58) Field of Classification Search
CPC ............. H01R 13/639; H01R 13/6275; H01R 13/6395; H01R 13/6277
See application file for complete search history.

(56) References Cited

U.S. PATENT DOCUMENTS 7,204,701 B1   4/2007 Balasingham et al.
7,448,897 B2 *  11/2008 Dawiedczyk ...... H01R 13/6275
                                                    439/357
(Continued)

FOREIGN PATENT DOCUMENTS

JP    2009543296 A    12/2009

OTHER PUBLICATIONS

International Search Report and Written Opinion dated Dec. 20, 2016 for International Application No. PCT/US2016/025230, 12 pages.

*Primary Examiner* — Ross N Gushi
(74) *Attorney, Agent, or Firm* — Schwabe, Williamson & Wyatt, P.C.

(57) ABSTRACT

Apparatuses, methods and storage medium associated with connectors for coupling to a computer processing unit (CPU) package are disclosed herein. In embodiments, a connector assembly for connection to a computer processing unit (CPU) package may include a connector housing. One or more electrical contacts of the connector housing may be to couple to the CPU package when the connector assembly is engaged with a mating connector assembly. The connector assembly may further include a mounting handle affixed to a top of the connector housing. The mounting handle may include a locking latch that extends from the mounting handle. The locking latch may engage with a notch within the mating connector assembly that, when engaged, the locking latch may provide a force to maintain coupling of the one or more electrical contacts with the CPU package when engaged with the mating connector assembly.

11 Claims, 15 Drawing Sheets

(51) Int. Cl.
   *H01R 12/71*   (2011.01)
   *H01R 13/627*  (2006.01)
   *H01R 13/629*  (2006.01)
   *H01R 25/00*   (2006.01)
   *H01L 23/367*      (2006.01)

(52) U.S. Cl.
   CPC ... *H01R 13/6275* (2013.01); *H01R 13/62938* (2013.01); *H01R 25/006* (2013.01); *H01L 23/3675* (2013.01); *H01R 2201/06* (2013.01)

(56) References Cited

U.S. PATENT DOCUMENTS

| | | | | |
|---|---|---|---|---|
| 7,997,909 B2* | 8/2011 | Xu | ............... | H01R 13/6594 439/607.57 |
| 8,454,381 B2* | 6/2013 | Wu | ............... | H01R 13/504 439/352 |
| 9,419,403 B2* | 8/2016 | Faith | ............... | H01R 12/70 |
| 2005/0054230 A1 | 3/2005 | Huang | | |
| 2006/0189199 A1* | 8/2006 | Lang | ............... | H01R 12/7005 439/374 |
| 2006/0189211 A1* | 8/2006 | Lang | ............... | H01R 13/629 439/607.04 |
| 2007/0173118 A1* | 7/2007 | Chen | ............... | H01R 23/6873 439/607.01 |
| 2012/0156938 A1* | 6/2012 | Zhang | ............... | H01R 13/6461 439/660 |
| 2012/0184126 A1* | 7/2012 | Chen | ............... | H01R 13/504 439/345 |
| 2013/0052852 A1* | 2/2013 | Li | ............... | H01R 13/6272 439/345 |
| 2014/0322958 A1* | 10/2014 | Wu | ............... | H01R 13/6275 439/372 |
| 2015/0364865 A1 | 12/2015 | Sutter et al. | | |

* cited by examiner

CONNECTOR FOR PROCESSOR PACKAGE

CROSS REFERENCE TO RELATED APPLICATIONS

The present application is a national phase entry under 35 U.S.C. § 371 of International Application No. PCT/US2016/025230, filed Mar. 31, 2016, entitled "CONNECTOR FOR PROCESSOR PACKAGE", which designated, among the various States, the United States of America. The entirety of the PCT/US2016/025230 Application is hereby incorporated by reference.

TECHNICAL FIELD

The present disclosure relates to the field of computing. More particularly, the present disclosure relates to connectors, and associated mounting arrangement of the connectors, for connection with a computer processing unit (CPU) package.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In legacy systems for connection of off-board elements to a CPU package, the connectors for the off-board elements were coupled to a circuit board mounted connector. Any signal from the off-board elements propagated through electrical traces of the circuit board and/or components mounted to the circuit board prior to reaching the CPU package. The time for the signals to propagate through the electrical traces of the circuit board and/or the components mounted to the circuit board became a limiting factor, with the propagation of the signals increasing time needed to process the signals.

Legacy systems were developed to allow for a single connector to be coupled directly to the CPU package. Accordingly, the signals from the single connector were delivered directly to the CPU package without propagating through the electrical traces of the circuit board and/or the components mounted to the circuit board. However, the legacy systems were limited to a single connector due to size limitations for connection to the CPU package and the size of the legacy connectors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
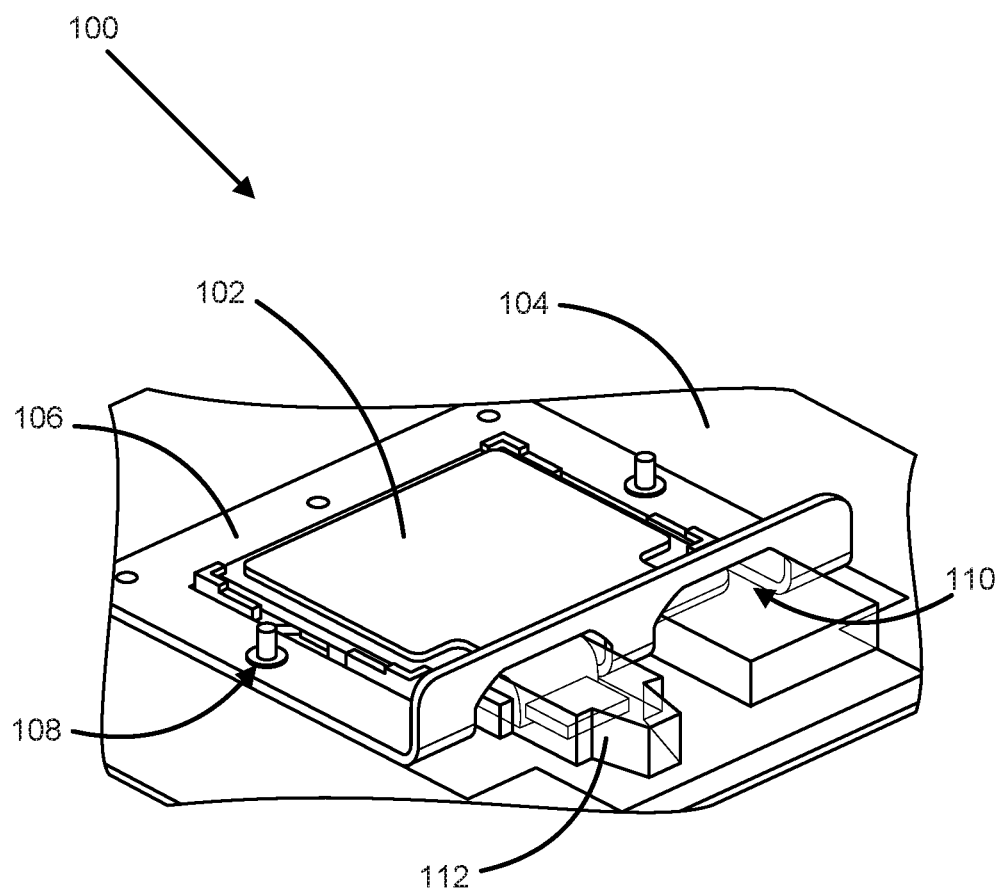
FIG. 1 illustrates an example computing arrangement having a computer processing unit (CPU) package with input/output (I/O) port and connector, according to various embodiments.

Apparatuses, methods and storage medium associated with connectors for coupling to a computer processing unit (CPU) package are disclosed herein. In embodiments, a connector assembly for connection to a computer processing unit (CPU) package may include a connector housing to receive one or more wires into a first end of the connector housing and provide one or more electrical contacts, corresponding to the one or more wires, accessible from a second end of the connector housing, opposite the first end of the connector housing, wherein the one or more electrical contacts may couple to the CPU package when the connector assembly is engaged with a mating connector assembly.

The connector assembly may further include a mounting handle affixed to a top of the connector housing, the top of the connector housing intermediate the first end of the connector housing and the second end of the connector housing. The mounting handle may include a locking latch that may extend from the mounting handle in a direction opposite from the connector housing. The locking latch may engage with a notch within the mating connector assembly that, when engaged, the locking latch may provide a force to maintain coupling of the one or more electrical contacts with the CPU package when engaged with the mating connector assembly.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the term "substantially maintain a position," or "substantially maintaining a position" may refer to small variances of the object from the position while the object still maintains any electrical and/or physical couplings between the object and corresponding coupled objects.

FIG. 1 illustrates an example computing arrangement 100 having computer processing unit (CPU) package with input/output (I/O) port and connector, according to various embodiments. The computing arrangement 100 may include a CPU package 102 mounted to a circuit board 104. The circuit board 104 may include a mother board within a computing device, wherein the CPU package 102 may include a CPU having one or more processor cores for performing operations of the computing device. In other embodiments, the circuit board 104 may include a board within a sound card, a video card, a peripheral component interface, a peripheral device, or some combination thereof, and the CPU package 102 may include a CPU for performing operations associated with the circuit board 104.

The computing arrangement 100 may further include a bolster plate 106. The bolster plate 106 may be affixed to the circuit board 104 by one or more fasteners 108. The fasteners may include, but are not limited to, standoffs, screws, bolts, nuts, or some combination thereof. In some embodiments, the bolster plate 106 may be affixed to the circuit board 104 by an adhesive and/or an adhesive layer.

A first portion of the bolster plate 106 may abut the circuit board 104 when the bolster plate 106 is mounted to the circuit board 104. The first portion of the bolster plate 106 may encircle the CPU package 102 on one or more sides. In some embodiments, the first portion of the bolster plate 106 may encircle an entirety of the CPU package 102.

A second portion of the bolster plate 106 may extend in a direction perpendicular to the first portion of the bolster plate 106 away from the circuit board 104. The second portion of the bolster plate 106 may intersect with the first portion of the bolster plate 106 at a gradual or sharp ninety degree bend in the bolster plate 106. In some embodiments, the second portion of the bolster plate 106 may extend in a direction from the first portion of the bolster plate 106 that is at an angle of between zero degrees and ninety degrees to the first portion. The second portion of the bolster plate 106 may extend in the perpendicular direction away from the circuit board 104 around one or more sides of the CPU package 102.

One or more apertures 110 may be formed in the second portion of the bolster plate 106. The apertures 110 may extend from the bend of the bolster plate 106 toward the edge of the second portion of the bolster plate 106 that extends away from the circuit board 104.

When the bolster plate 106 is affixed to the circuit board 104, the apertures 110 may form one or more openings with the circuit board 104 for mounting of connector assemblies 112, connectors, door frame inserts, or some combination thereof. The opening may be defined by the circuit board 104 as a bottom side of the opening and edges of the apertures 110 as the top side of the opening, opposite the bottom side of the opening, and the left side and right side of the opening. Door frame inserts and other variants will be illustrated and described more fully with references to the remaining figures later.

The apertures 110 and/or the opening may have a size and/or shape complementary, such as corresponding, to the connector assembly 112, the connector and/or the door frame insert to be mounted within the opening. The apertures 110 and the circuit board 104 may form a substantially rectangular opening for mounting of the connector assembly 112, the connector and/or the door frame insert. In some embodiments, the apertures may include curved edges, such that the opening may form a rectangle with curved upper corners, may have a curved upper portion, or some combination thereof.

Figure 2:
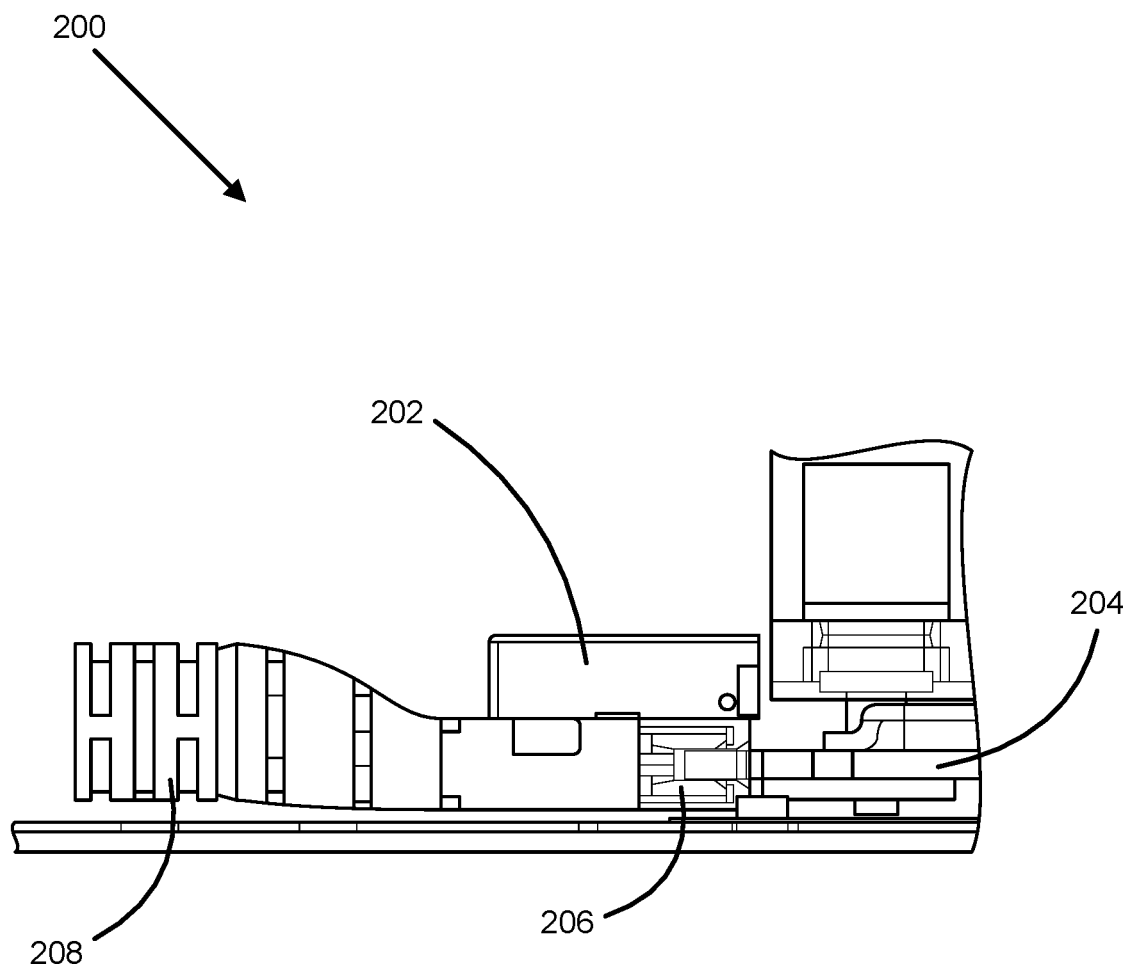
FIG. 2 illustrates an example a CPU package connection arrangement, according to various embodiments.

FIG. 2 illustrates an example CPU package connection arrangement 200, according to various embodiments. The CPU package connection arrangement 200 may include a connector assembly 202 coupled to a CPU package 204. The coupling between the connector assembly 202 and the CPU package 204 may be designed to withstand an amount of force, e.g., 10 pound-force (lbf), applied to either or both of the connector assembly 202 and the CPU package 204 without the connector assembly 202 and the CPU package 204 being uncoupled.

The connector 202 may include one or more electrical contacts 206. The electrical contacts 206 may contact a portion of the CPU package 204 to provide, in some embodiments, an electrical coupling between one or more wires 208 entering the connector assembly 202 at a first end, opposite a first end of the connector assembly 202 from which the electrical contacts 206 are accessible. The electrical contacts 206 may contact the portion of the CPU package 204 on a top portion of the CPU package 204, a bottom portion of the CPU package 204, an end of the CPU package 204, or some combination thereof. The portion of the CPU package 204 contacted by the electrical contacts 206 may include one or more electrical pads coupled to a CPU of the CPU package 204, thereby providing coupling between the connector assembly 202 and the CPU.

Figure 3:
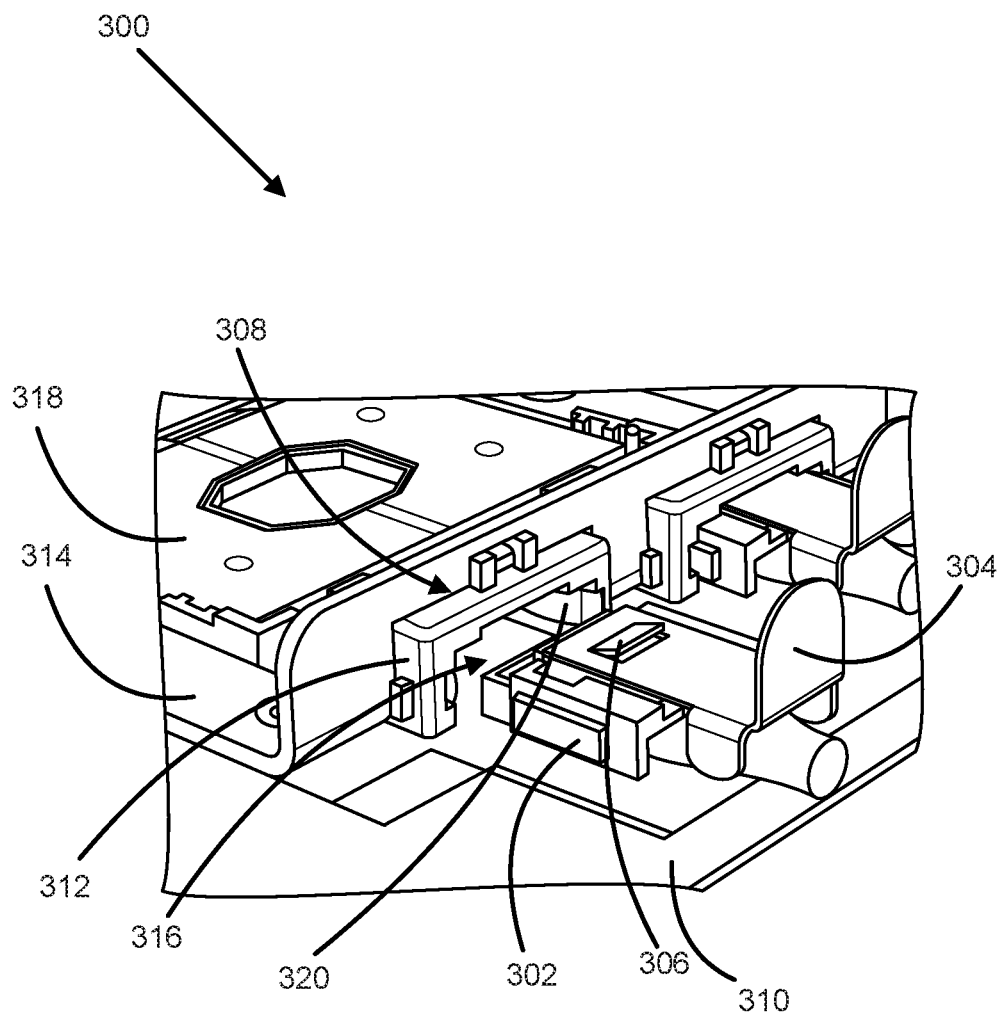
FIG. 3 illustrates an example connector assembly with a mounting handle and corresponding mating connector assembly, according to various embodiments.

FIG. 3 illustrates an example connector assembly 300 with a mounting handle 304 and corresponding mating connector assembly 308, according to various embodiments. The connector assembly 300 may include a connector housing 302. The connector assembly 300 and/or the connector housing 302 may include one or more of the features of the connector assembly 112 of FIG. 1 and/or the connector assembly 202 of FIG. 2.

The connector assembly 300 may include the mounting handle 304 affixed to a top of the connector housing 302. The top of the connector housing 302 may be intermediate a first end of the connector housing 302, that receives one or more wires, and a second end of the connector housing 302, where one or more electrical contacts corresponding to the one or more wires are accessible. The one or more wires may include one or more high speed cable wires. The top of the connector housing 302 may be located opposite a circuit board 310, to which the mating connector assembly 308 is affixed, when the connector assembly 300 is engaged with the mating connector assembly 308.

The mounting handle 304 may be L-shaped, with a portion of the mounting handle 304 extending away from the connector housing 302. The mounting handle 304 may include a first portion of the mounting handle 304 that extends substantially parallel to the connector housing 302 and a second portion of the mounting handle 304 that extends away from the connector housing 302 in a substantially perpendicular direction to the connector housing. The second portion of the mounting handle 304 may be located outside of the footprint of the connector housing 302 toward the first end of the connector housing 302.

The mounting handle 304 may be affixed to the connector housing 302 at a first end of the mounting handle 304. The mounting handle 304 may be affixed to the connector housing 302 towards the second end of the connector housing 302. The mounting handle 304 may be affixed to the connector housing 302 at angle greater than zero from the top of the connector housing 302, such that, with the exception of the first end, the rest of the mounting handle 304 resides above, and does not contact the connector housing 302, absent a compressing force applied to the mounting handle 304 in a direction toward the connector housing 302.

The mounting handle 304 may be pliably affixed to the connector housing 302 at the first end, such that the mounting handle 304 may rotate about the point of affixation. As force is applied to the mounting handle 304, mounting handle 304 and/or the connector housing 302 may flex near the point of affixation allowing the mounting handle 304 to rotate.

In some embodiments, the mounting handle 304 may be affixed to the connector housing 302 at the first end by a hinge, or some other hinge-type apparatus. The hinge may allow the mounting handle 304 to freely rotate around the hinge in response to forces being applied to the mounting handle 304.

In some embodiments, the mounting handle 304 may be rigidly affixed to the connector housing 302 at the first end of the mounting handle 304. In these embodiments, the mounting handle 304 may be resilient. The mounting handle 304 may flex in response to forces applied to the mounting handle 304 and return to an original position in response to removal of the forces.

The connector assembly 300 may further include one or more springs located between the connector housing 302 and the mounting handle 304. The springs may be configured to apply a separating force upon the mounting handle 304, thereby maintaining space between the mounting handle 304 and the connector housing 302, with the exception of the point of affixation, in the absence of any external forces being applied to the mounting handle 304 and/or the connector housing 302. As a compressing force is applied to the mounting handle 304, in a direction substantially opposite the separating force, the spring may be compressed allowing a portion of the mounting handle 304 to contact the connector housing 302. The spring may again extend in response to the removal of the compressing force, again maintaining the space between the mounting handle 304 and the connector housing 302.

The mounting handle 304 may include a locking latch 306, which may be rigid. In some embodiments, the locking latch 306 may be formed of the same material as the mounting handle 304. The locking latch 306 may extend from the mounting handle 304 in a direction opposite the connector housing 302. The locking latch 306 may extend at an angle between zero and forty-five degrees from the mounting handle 304. An end of the locking latch 306, opposite the end of the mounting handle 304 affixed to the connector housing 302, may be a greater distance away from the connector housing 302 than the end of the locking latch 306 toward the first end of the mounting handle 304.

The locking latch 306 may engage with a notch (illustrated as 408 of FIG. 4) in a top portion of the mating connector assembly 308 when the connector assembly 300 is engaged with the mating connector assembly 308. When inserting the connector assembly 300 into the mating connector assembly 308 for engagement, a downward force may be applied by the top portion of the mating connector assembly 308 on the mounting handle 304 as a portion of the mounting handle 304 and/or the locking latch 306 contact the top portion of the mating connector assembly 308. The mounting handle 304 may flex toward the connector housing 302 in response to the application of the force, allowing the connector assembly 300 to fit within the mating connector assembly 308.

When the connector assembly 300 is fully inserted, or substantially fully inserted, into the mating connector assembly 308, the locking latch 306 may align with the notch in the top portion of the mating connector assembly 308 and the mounting handle 304 may move away from the connector housing 302 due to removal of downward force on the locking latch 306. As the mounting handle 304 moves away from the connector housing 302, the locking latch 306 may move into the notch of the mating connector assembly 308, thereby engaging with the notch. When the connector assembly 300 is fully inserted, or substantially fully inserted, into the mating connector assembly 308, one or more electrical contacts within the connector housing 302 may be coupled to a CPU package 318.

When engaged with the notch of the mating connector assembly 308, the locking latch 306 may maintain, or substantially maintain, a position of the connector assembly 300 within the mating connector assembly 308 when engaged. The locking latch 306 may provide a force to maintain the coupling of one or more electrical contacts within the connector housing 302 with the CPU package 318. The locking latch 306 may be able to withstand an amount of force, e.g. 10 lbf, in any direction while maintaining, or substantially maintaining, the position of the connector assembly 300 within the mating connector assembly 308. The locking latch 306 may press against inside walls of the notch in response to forces being applied to the connector assembly 300 and/or the mating connector assembly 308, the contact between the locking latch 306 and the notch substantially preventing movement of the connector assembly 300 relative to the mating connector assembly 308 in response to the forces.

In order to disengage the connector assembly 300 from the mating connector assembly 308, a downward force may be applied to the mounting handle 304 to disengage the locking latch 306 from the notch. In response to the downward force, the mounting handle 304 may move toward the connector housing 302 and the locking latch 306 may move downwards such that it is no longer within the notch. Once the locking latch 306 is disengaged, the connector assembly 300 may be removed from the mating connector assembly 308 by applying a force to the connector assembly 300 in a direction away from the mating connector assembly 308.

The connector assembly 300 may be designed to limit space occupied by the connector assembly 300 and to limit the effect of the connector assembly 300 on air circulation around a CPU package 318. The top of the connector housing 302, when coupled to the CPU package 318, may be below the base of a heatsink of the CPU package 318. In some embodiments, a height of the connector housing 302 may be less than or equal to 11 millimeters, measured from the top of the connector housing 302 to the bottom of the connector housing 302. In some embodiments, the connector housing 302 with the mounting handle 304 may have a height of less than or equal to 11 millimeters. In some further embodiments, the connector housing 302 and the first portion of the mounting handle 304 that extends substantially perpendicular to the connector housing 302 may have a height of less than or equal to 11 millimeters, while the second portion of the mounting handle 304 that extends substantially perpendicular to the connector housing 302 may extend to a height greater than the 11 millimeters. A width of the connector housing 302 may correspond to an amount of wires entering the connector housing 302. In some embodiments, the width of the connector housing 302 may be less than or equal to 22 millimeters, measured from a first side of the connector housing 302 to a second side of the connector housing 302, wherein the first side and the second of the connector housing 302 are located intermediate to the first end and the second end of the connector housing 302.

The mating connector assembly 308 may include a door frame insert 312. The door frame insert 312 may be mounted to the circuit board 310 by a bolster plate 314. The bolster plate 314 may include one or more of the features of the bolster plate 106 of FIG. 1.

The door frame insert 312 may be mounted within an opening of the bolster plate 314. The opening of the bolster plate 314 may be of a size and shape corresponding to an outside of the door frame insert 312, such that the bolster plate 314, when affixed to the circuit board 310, may contact the door frame insert 312 and rigidly affix the door frame insert 312 to the circuit board 310.

The door frame insert 312 may include a pass-through opening 316 to receive the connector assembly 300. The pass-through opening 316 may have a size and shape corresponding to a size and shape of the connector assembly 300.

The pass-through opening 316 may include four sides, with three of the sides abutting the door frame insert 316 and a fourth, bottom side abutting the circuit board 310. The door frame insert 316 may have three inner walls defining the three sides of the pass-through opening 316 and the circuit board 310 may define the fourth side of the pass-through opening 316. When the connector assembly 300 is engaged with the mating connector assembly 308, a bottom portion of the connector housing 302 may abut the circuit board 310 that comprises the fourth, bottom side of the pass-through opening 316.

The door frame insert 312 may include the notch in an upper portion of the door frame insert 312 to engage with the locking latch 306. The notch may extend into the upper portion of the door frame insert 312 and may be shaped corresponding to the locking latch 306. In some embodiments, the notch may extend through the upper portion of the door frame insert 312.

When the notch is engaged with the locking latch 306, the notch may substantially maintain a position of the connector assembly 300. The notch may be able to substantially maintain the position of the connector assembly 300 for forces up to 10 lbf applied to the connector assembly 300 and/or the mating connector assembly 308 in any direction.

The mating connector assembly 308 may further include one or more springs 320 mounted to one or more inner walls of the door frame insert 312. The springs 320 may be configured to contact the connector housing 302 and/or the mounting handle 304 when the connector assembly 300 is engaged with the mating connector assembly 308 and apply stabilizing forces between the mating connector assembly 308 and the connector assembly 300. The stabilizing forces may reduce or prevent movement between the connector assembly 300 and the mating connector assembly 308 due to small forces, such as vibrations. In some embodiments, the mating connector assembly 308 may include two springs 320 mounted to two opposing inside walls of the door frame insert 312 and may contact the sides of two sides of the connector housing 302 when the connector assembly 300 is engaged with the mating connector assembly 308.

The bolster plate 314 may include two apertures for mounting of mating connector assemblies, such as the mating connector assembly 308. Each of the two apertures may include one or more of the features of the opening of the bolster plate 314 described above and/or the one or more apertures 110 of FIG. 1. Additionally, the bolster plate 314 may include one or more of the features of the bolster plate 106 of FIG. 1.

The two apertures may be formed in a portion of the bolster plate 314 that extends perpendicularly away from the circuit board 310 when the bolster plate 314 is affixed to the circuit board 310. The portion of the bolster plate 314 that extends perpendicularly may be located on at least one side of the CPU package 318.

The location of the two apertures may correspond to a position and/or size of the CPU package 318. The two apertures may be positioned such that each of the apertures faces a side of the CPU package 318 when the bolster plate 314 is mounted to the circuit board 310. Accordingly, the two apertures may be formed adjacent to each other within the bolster plate 314 on the side of the CPU package 318. The distance between an inner edge of a first aperture of the two apertures may be less than or equal to five millimeters from an inner edge of a second aperture of the two apertures, wherein the inner edge of the first aperture is the closest edge of the first aperture to the second apertures and the inner edge of the second aperture is the closest edge of the second aperture to the first aperture. Further, the outer edge of the first aperture may be less than or equal to 50 millimeters from the outer edge of the second aperture, wherein the outer edge of the first aperture is the farthest edge of the first aperture from the second aperture and the outer edge of the second aperture is the farthest edge of the second aperture from the first aperture. The upper edges of the two apertures may be less than or equal to 11 millimeters from the circuit board 310 when the bolster plate 314 is mounted to the circuit board 310.

Figure 4:
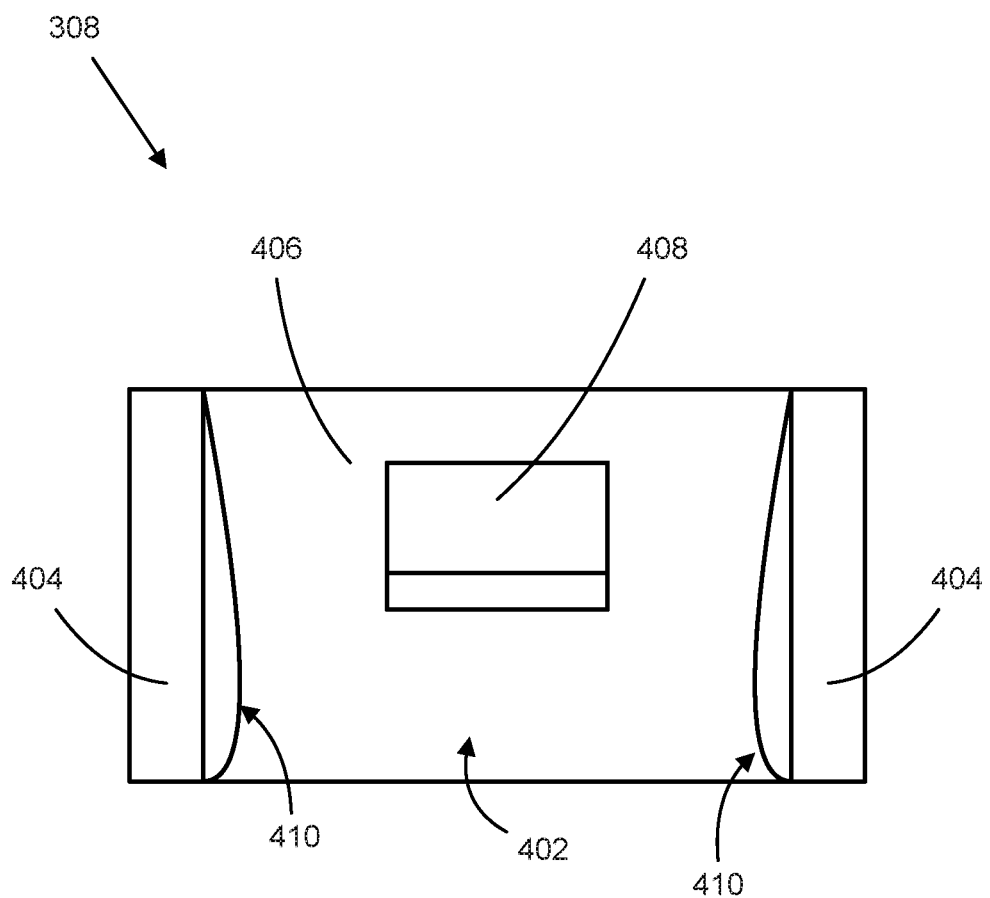
FIG. 4 illustrates the example mating connector assembly of FIG. 3 illustrated from a bottom view.

FIG. 4 illustrates the example mating connector assembly 308 of FIG. 3 illustrated from a bottom view. The mating connector assembly 308 may include a front portion 402 of the pass-through opening 316 for insertion of the connector assembly 300 of FIG. 3. The mating connector assembly 308 may include sidewalls 404 of the door frame insert 312 and a top portion 406 of the door frame insert 312.

A notch 408 may be formed in the top portion 406. The notch 408 may include one or more of the features of the notch described above in FIG. 3. The notch 408 may be configured to receive and engage with a locking latch, such as the locking latch 306 of FIG. 3, when the connector assembly 300 is fully inserted, or substantially fully inserted, into the mating connector assembly 308. The notch 408 may extend into the top portion 406, with the greatest amount of extension of the notch 408 into the top portion 406 located toward the front portion 402. When the notch 408 is engaged with the locking latch, the notch 408 and/or the locking latch may substantially maintain a position of the connector assembly 300 relative to the mating connector assembly 308.

The mating connector assembly 308 may further include one or more springs 410 mounted to the insides of the sidewalls 404. The springs 410 may include one or more of the features of the springs 320 of FIG. 3.

Figure 5:
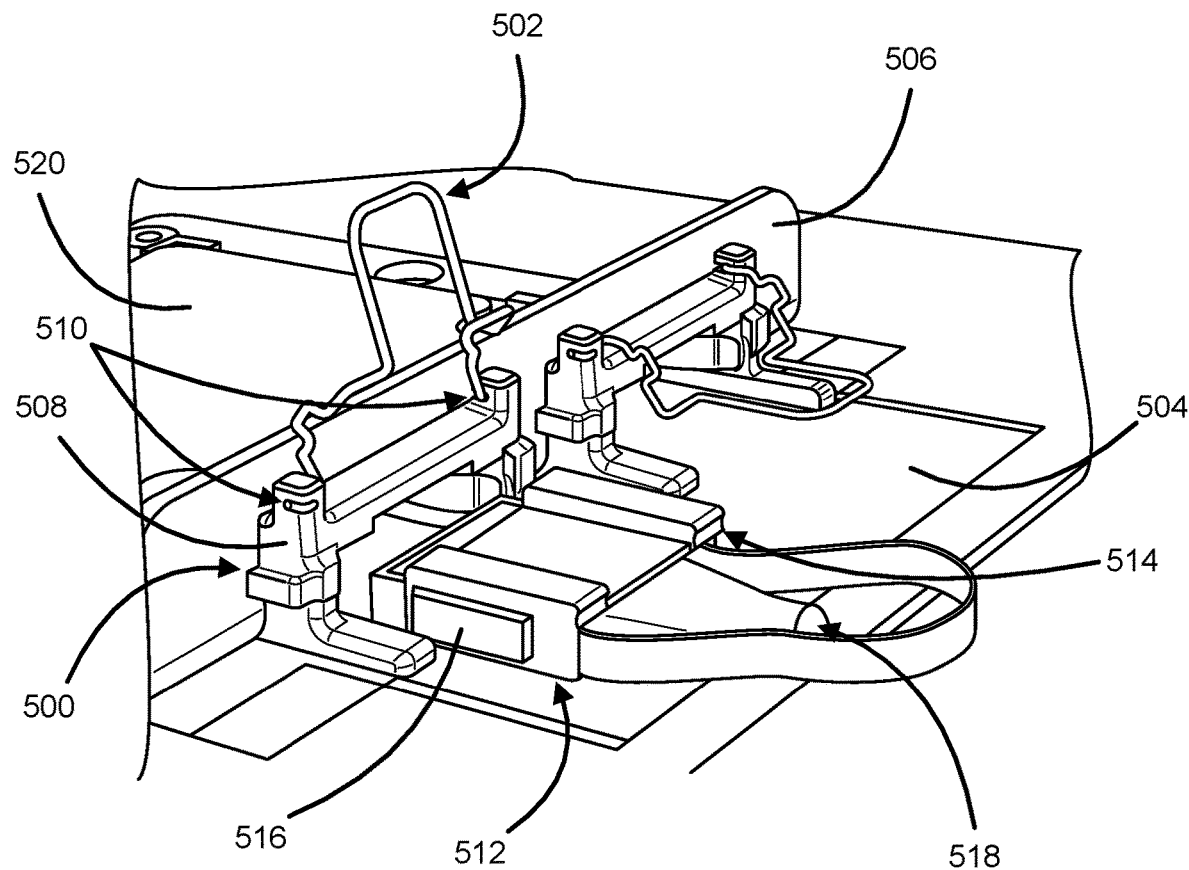
FIG. 5 illustrates an example connector assembly with a wire bale mounting mechanism, according to various embodiments.

FIG. 5 illustrates an example connector assembly 500 with a wire bale mounting mechanism, according to various embodiments. The connector assembly 500 may include one or more of the features of the mating connector assembly 308 of FIG. 3. The connector assembly 500 may be affixed to a circuit board 504 by a bolster plate 506. The bolster plate 506 may include one or more of the features of the bolster plate 106 of FIG. 1 and/or the bolster plate 314 of FIG. 3.

The connector assembly 500 may include a door frame insert 508. The door frame insert 508 may include one or more of the features of the door frame insert 312 of FIG. 3. The connector assembly may include a wire bale 502 rotationally mounted to the door frame insert 508. The wire bale 502 may be mounted to the door frame insert 508 at mounting points 510 located on each side of the door frame insert 508. The wire bale 502 may be configured to rotate around an imaginary line drawn through the mounting points 510 in response to an application of force to the wire bale 502.

A mating connector assembly 512 may engage with the connector assembly 500 to couple electrical contacts of the mating connector assembly 512 to a CPU package 520. The mating connector assembly 512 may include one or more of the features of the connector assembly 202 of FIG. 2 and/or the connector assembly 300 of FIG. 3.

The mating connector assembly 512 may include one or more notches 514 formed in a connector housing 516. The notches 514 may be formed in a first end of the connector housing 516 that receives one or more wires 518. The notches 514 may be shaped to receive a portion of the wire bale 502.

When the mating connector assembly 512 is in a fully inserted, or substantially fully inserted, into the connector assembly 500, the wire bale 502 may be rotated into a locked position. In the locked position, a portion of the wire bale 502 may engage with the notches 514. When engaged with the notches 514, the wire bale 502 may be in a down position and may be substantially parallel to the circuit board 504. The wire bale 502 may be configured to maintain, or substantially maintain, a position of the mating connector assembly 512 to the connector 500 when in the locked position. The wire bale 502 may withstand forces of 10 lbf applied in any direction to the mating connector assembly 512 and/or the connector assembly 500 while maintaining, or substantially maintaining, the position of the mating connector assembly 512 when in the locked position.

The wire bale 502 may be rotated into an unlocked position to allow the mating connector assembly 512 to be uncoupled from the connector assembly 500. When in the unlocked position, the wire bale 502 may no longer be engaged with the notches 514 and may no longer be substantially parallel to the circuit board 504. When in the unlocked position, the mating connector assembly 512 may be uncoupled from the connector assembly 500 by applying a force to the mating connector assembly 512 in a direction away from the connector assembly 500.

Figure 6:
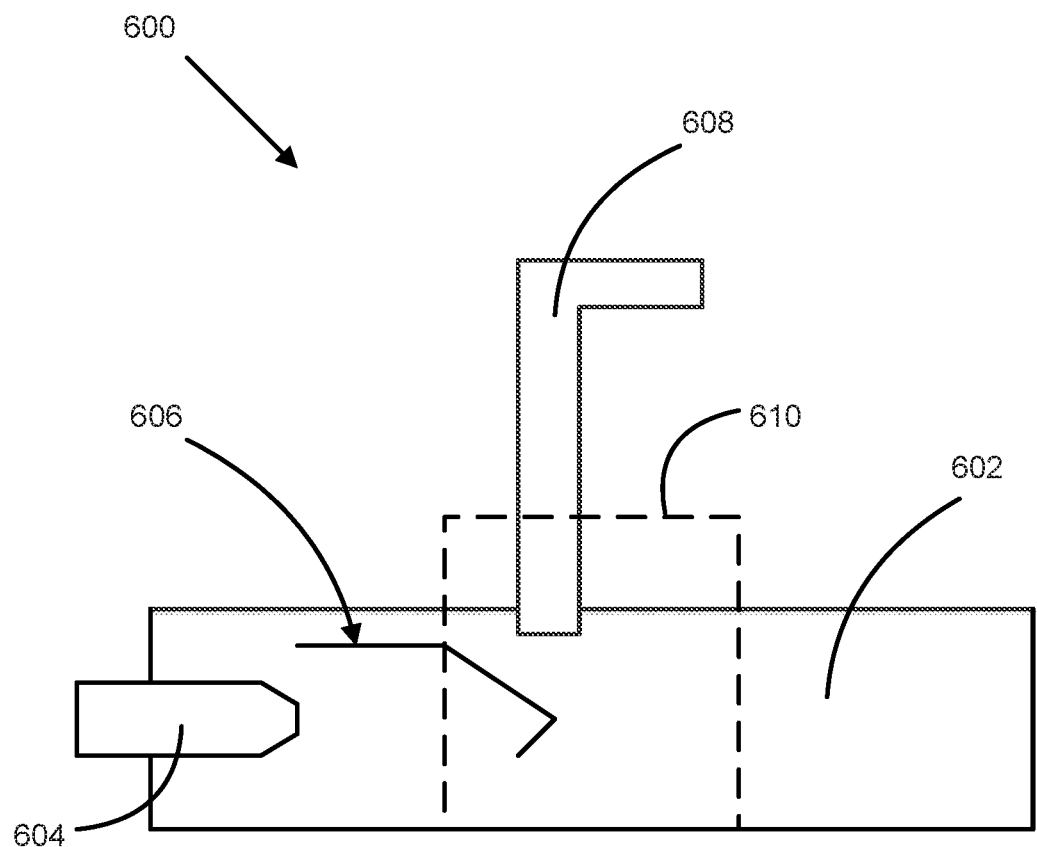
FIG. 6 illustrates an example castlegate-style locking mechanism illustrated from a side view in an unlocked position, according to various embodiments.

FIG. 6 illustrates an example castlegate-style locking mechanism 600 illustrated from a side view in an unlocked position, according to various embodiments. The castlegate-style locking mechanism 600 may be utilized for securing a connector assembly 602 to a CPU package 604. The connector assembly 602 may include one or more of the features of the connector assembly 112 of FIG. 1, the connector assembly 202 of FIG. 2 and/or the connector assembly 300 of FIG. 3. The CPU package 604 may include one or more of the features of the CPU package 102 of FIG. 2, the CPU package 204 of FIG. 2, the CPU package 318 of FIG. 3 and/or the CPU package 520 of FIG. 5.

The connector assembly 602 may have one or more springs 606 attached to one or more sides of the connector assembly 602. The springs 606 may be affixed to the connector assembly 602 toward an end of the connector assembly 602 configured to couple with the CPU package 604 and extend toward an opposite end of the connector assembly 602. The connector assembly 602 may include two springs with one spring located on each side of the connector assembly 602 that extends perpendicularly from the circuit board when the connector assembly 602 is inserted into the castlegate-style locking mechanism 600.

A portion of the spring 602 may be configured to contact a castlegate-style door 608 of the castlegate-style locking mechanism 600 when the castlegate-style door 608 is in a locked position. The springs 606 may be configured to be compressed in response to the contact with the castlegate-style door 608 and may apply a force to the connector assembly 602 toward the CPU package 604. The force may maintain a position of the connector assembly 602 relative to the CPU package 604 and may withstand forces of 10 lbf in any direction.

The castlegate-style locking mechanism 600 may include a door frame insert 610. The door frame insert 610 may include one or more of the features of the door frame insert 312 of FIG. 3 and/or the door frame insert 508 of FIG. 5. The door frame insert 312 may be mounted to a circuit board (illustrated as 802 of FIG. 8), to which the CPU package 604 is mounted, by a bolster plate (illustrated as 804 of FIG. 8). The circuit board may include one or more of the features of the circuit board 104 of FIG. 1, the circuit board 310 of FIG. 3 and/or the circuit board 504 of FIG. 5. The bolster plate may include one or more of the features of the bolster plate 106 of FIG. 1, the bolster plate 314 of FIG. 3 and/or the bolster plate 506 of FIG. 5.

The door frame insert 610 may include an opening in a top portion of the door frame insert 610 into which the castlegate-style door 608 may be movably mounted. The top portion of the door frame insert 610 may be opposite to the circuit board when the door frame insert 610 is mounted to the circuit board. The opening in the top portion of the door frame insert 610 may allow the castlegate-style door 608 to move in up and down directions relative and perpendicular to the circuit board.

The castlegate-style door 608 may include a lower edge that is to contact or abut the circuit board when the castlegate-style door 608 is in a down position. An aperture (illustrated as 806 of FIG. 8) may be formed in the castlegate-style door 608 extending from the lower edge that is to contact or abut the circuit board. The aperture may receive the connector assembly 602 and the castlegate-style door may encircle the connector assembly 602 on three sides when the castlegate-style door 608 is in the down position.

A width of the aperture may correspond to a width of the connector assembly 602. The width of the aperture may be measured from a first edge of the aperture that extends perpendicular to the circuit board to a second edge of the aperture that extends perpendicular to the circuit board, wherein the first edge is opposite from the second edge.

A height of the aperture may correspond to a height of the connector assembly 602. The height of the aperture may be measured from the edge of the castlegate-style door 608 that contacts the circuit board when the castlegate-style door 608 is in the down position to a top side of the aperture opposite the edge.

The castlegate-style door 608 may be L-shaped. A first portion of the castlegate-style door 608 may extend in a direction perpendicular to the circuit board when movably mounted to the door frame insert 610, with the door frame insert 610 mounted to the circuit board, and a second portion of the castlegate-style door 608 may extend in a direction parallel to the circuit board. A bend or corner between the first portion and the second portion of the castlegate-style door 608 may be located at a position such that the edge of the castlegate-style door 608 configured to contact or abut the circuit board when in the down position may make contact with or abut the circuit board without the second portion of the castlegate-style door 608 interfering with a top portion of the door frame insert 610.

The castlegate-style door 608, when in the unlocked or up position, may have the edge of the castlegate-style door 608 that is to contact or abut the circuit board located at a height above the one or more springs 606 of the connector assembly 602. Accordingly, when the connector assembly is inserted and removed from the castlegate-style locking mechanism 600, the springs 606 may pass under the edge without contacting the castlegate-style door 608. Thereby, the connector assembly 602 may be easily inserted and removed from the castlegate-style locking mechanism 600 when the castlegate-style door 608 is in the unlocked or up position.

Figure 7:
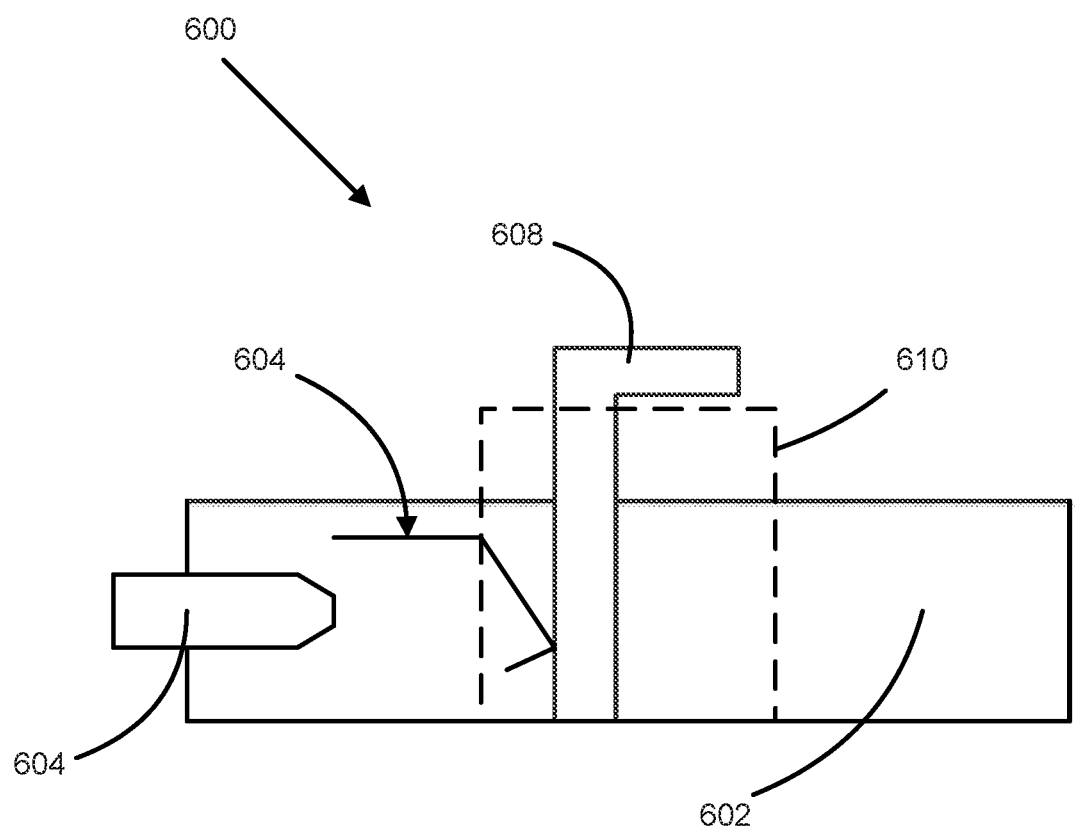
FIG. 7 illustrates the example castlegate-style locking mechanism of FIG. 6 illustrated from a side view in a locked position, according to various embodiments.

FIG. 7 illustrates the example castlegate-style locking mechanism 600 of FIG. 6 illustrated from a side view in a locked position, according to various embodiments. The castlegate-style door 608 may be in a down position with the edge of the castlegate-style door 608 contacting or abutting the circuit board. Additionally, when the castlegate-style door 608 is in the down position, the sides of the aperture of the castlegate-style door 608 may contact or abut the connector assembly 602 on three sides.

When in the down position, one or more portions of the castlegate-style door 608 may make contact with the one or more springs 606 causing the springs 606 to compress. When compressed, the springs 606 may apply a force to the connector assembly 602 in the direction toward the CPU package 604. The force may maintain a position of the connector assembly 602 to the CPU package 604, withstanding forces of 10 lbf in any direction.

Figure 8:
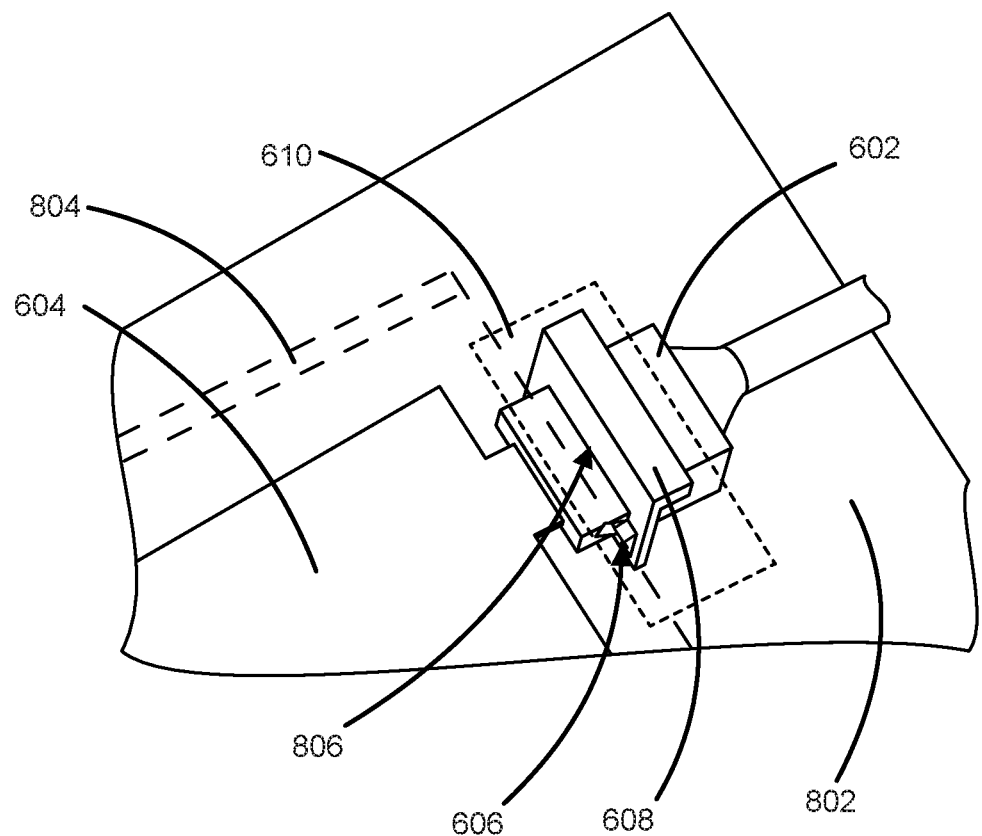
FIG. 8 illustrates the example castlegate-style locking mechanism of FIG. 6 illustrated from a perspective view, according to various embodiments.

FIG. 8 illustrates the example castlegate-style locking mechanism 600 of FIG. 6 illustrated from a perspective view, according to various embodiments. The door frame insert 610 may be mounted to a circuit board 802. The door frame insert 610 may be mounted to the circuit board 802 by the bolster plate 804. Further, the CPU package 604 may be mounted to the circuit board 802. The circuit board 802 may include one or more of the features of the circuit board 104 of FIG. 1, the circuit board 310 of FIG. 3 and/or the circuit board 504 of FIG. 5. The bolster plate 804 may include one or more of the features of the bolster plate 106 of FIG. 1, the bolster plate 314 of FIG. 3 and/or the bolster plate 506 of FIG. 5.

As can be seen, the castlegate-style door 608 may extend around the three sides of the connector assembly 602. The connector assembly 602 may extend through the aperture 806 of the castlegate-style door 608 when coupled to the CPU package 604. When in the locked or down position, the castlegate-style door 608 may contact the springs 606 on both sides of the connector assembly 602. The lower end of the castlegate-style door 608 may contact or abut the circuit board 802 when in the locked or down position.

Figure 9:
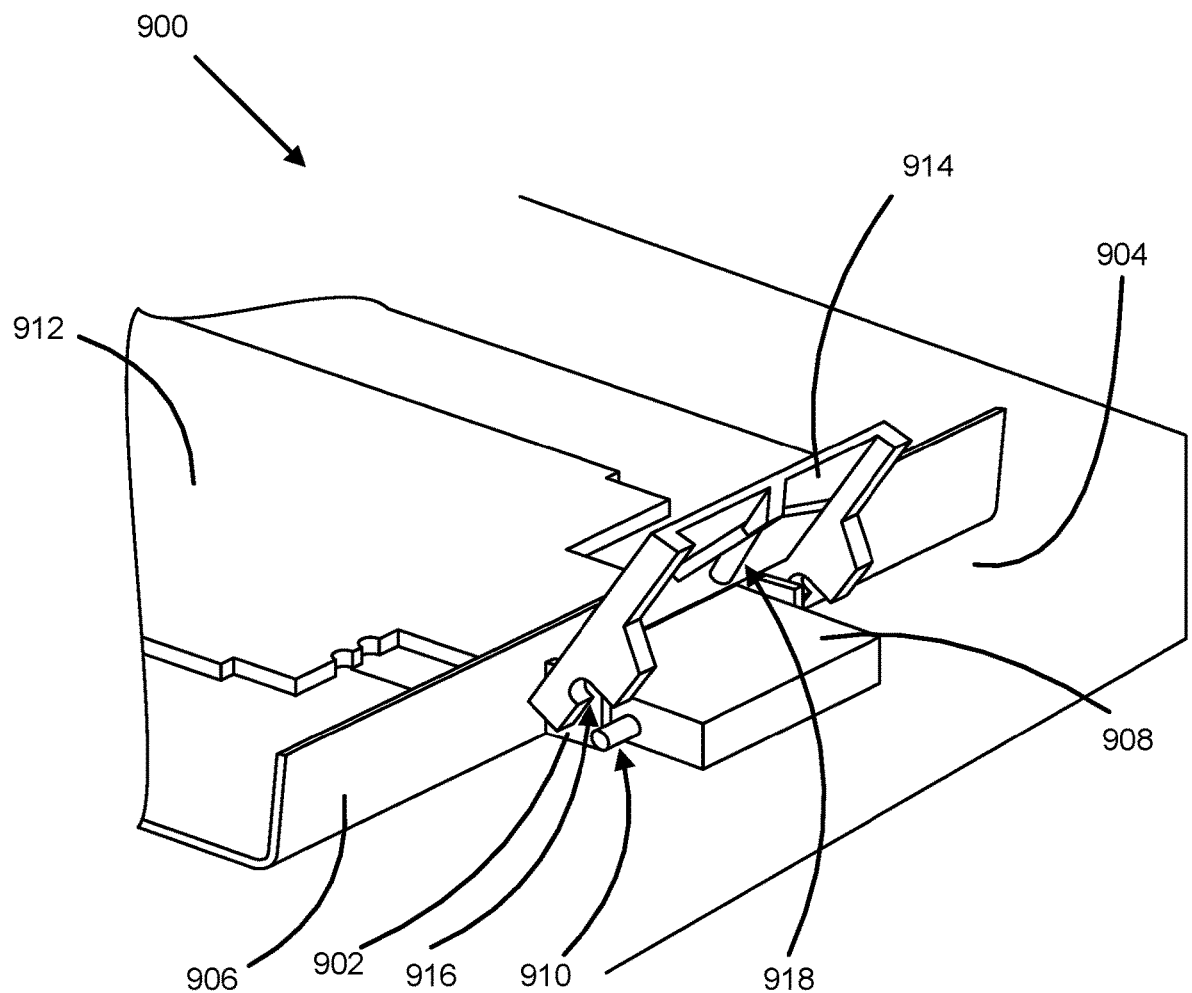
FIG. 9 illustrates an example vertical swing door-type locking mechanism, according to various embodiments.

FIG. 9 illustrates an example vertical swing door-type locking mechanism 900, according to various embodiments. The vertical swing door-type locking mechanism 900 may include a door frame insert 902 mounted to a circuit board 904 by a bolster plate 906. The door frame insert 902 may include one or more of the features of the door frame insert 312 of FIG. 3, the door frame insert 508 of FIG. 5 and/or the door frame insert 610 of FIG. 6. The circuit board 904 may include one or more of the features of the circuit board 104 of FIG. 1, the circuit board 310 of FIG. 3, the circuit board 504 of FIG. 5 and/or the circuit board 802 of FIG. 8. The bolster plate 906 may include one or more of the features of the bolster plate 106 of FIG. 1, the bolster plate 314 of FIG. 3, the bolster plate 506 of FIG. 5 and/or the bolster plate 804 of FIG. 8.

The vertical swing door-type locking mechanism 900 may secure a connector assembly 908 to a CPU package 912 through the door frame insert 902. The connector assembly 908 may include one or more of the features of the connector assembly 112 of FIG. 1, the connector assembly 202 of FIG. 2, the connector assembly 300 of FIG. 3, the mating connector assembly 512 of FIG. 5 and/or the connector assembly 602 of FIG. 6. The CPU package 912 may include one or more of the features of the CPU package 102 of FIG. 1, the CPU package 204 of FIG. 2, the CPU package 318 of FIG. 3, the CPU package 520 of FIG. 5, and/or the CPU package 604 of FIG. 6. The connector assembly 908 may further include one or more cams 910 extending from a main body of the connector assembly 908. The connector assembly 908 may include two cams 910, with one cam extending from each of the two sides of the connector assembly 908, the two sides extending perpendicularly to the circuit board 904 when the connector assembly 908 is engaged with the door frame insert 902.

The vertical swing door-type locking mechanism 900 may include a swing door 914 rotationally mounted to the door frame insert 902. The swing door 914 may be mounted to the door frame insert 902 at one or more connection points located on either side aperture through which the connector assembly 908 passes through when coupled to the CPU package 912. The swing door 914 may rotate around an imaginary line passing through the one or more connection points in response to an application of force to the swing door 914.

The swing door 914 may be configured to transition between a locked position and an unlocked position. In the locked position, the swing door 914 is rotated into a position where a main body of the swing door 914 is substantially parallel to the circuit board 904. In the unlocked position, the swing door 914 may be rotated around the connection points away from the circuit board 904. In the unlocked position, the main body of the swing door 918 may be at a non-zero angle to the circuit board 904.

The vertical swing door-type locking mechanism 900 may include one or more springs 918 attached on one end to the swing door 914 and on the other end to the bolster plate 906. The one or more springs 918 may include leaf springs. The one end of the springs 918 attached to the swing door 914 may be attached to a bottom portion of the main body of the swing door. The springs 918 may be configured to contract absent external forces. As the springs 918 contracts, the swing door 914 may be drawn toward the circuit board 904 and into the locked position. Accordingly, a natural state, absent any external forces, of the swing door 914 may be in the locked position due to the contraction of the springs 918 that applies force around the point of rotation. In response to a lifting force applied to the swing door 914 away from the circuit board 904, the springs 918 may extend allowing the swing door 914 to transition into the unlocked position.

The swing door 914 may include one or more notches 916, or curved portions of the swing door 914, formed in one or more portions the swing door 914 which extend perpendicularly to the main body of the swing door 914 toward the circuit board 904. When in the locked position and with the connector assembly 908 inserted into the door frame insert 902, the notches 916 may engage with the one or more cams 910 of the connector assembly 908. When the notches 916 are engaged with the cams 910, the swing door 914 may maintain, or substantially maintain, a location of the connector assembly 908 to the CPU package 912. The swing door 914 may be able to withstand forces of 10 lbf in any direction while maintaining, or substantially maintaining, the location of the connector assembly 908.

When in the swing door 914 is transitioned to or is in the unlocked position, the notches 916 may disengage or be disengaged from the cams 910. Accordingly, the swing door 914 may no longer maintaining the position of the connector assembly 908 to the CPU package 912, and the connector assembly 908 may be easily uncoupled from the CPU package 912 by applying a force in the direction away from the CPU package 912 to the connector assembly 908.

Figure 10:
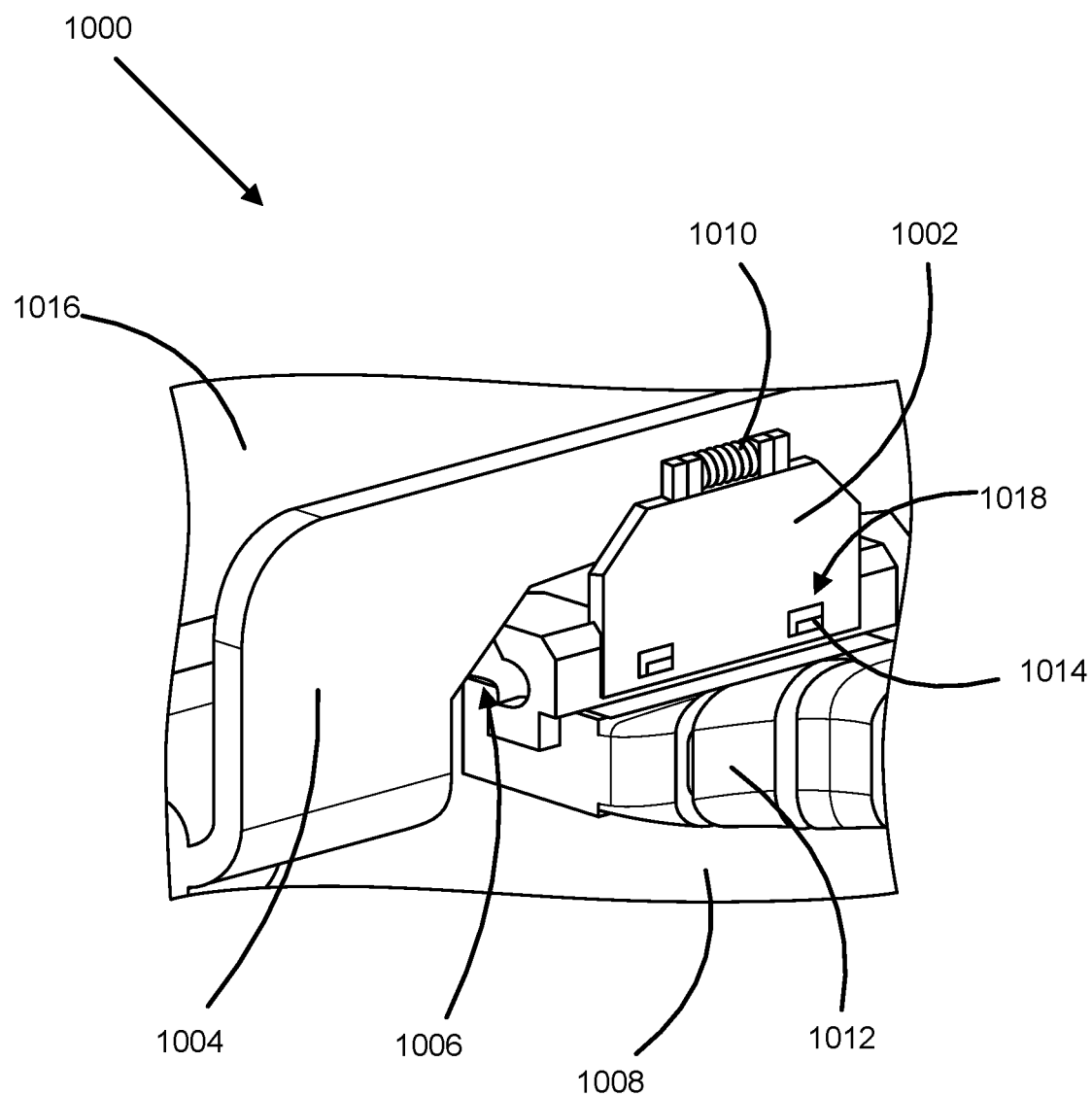
FIG. 10 illustrates another example vertical swing door-type locking mechanism, according to various embodiments.

FIG. 10 illustrates another example vertical swing door-type locking mechanism 1000, according to various embodiments. The vertical swing door-type locking mechanism 1000 may include a bolster plate 1004 mounted to a circuit board 1008. The bolster plate 1004 may include one or more of the features of the bolster plate 106 of FIG. 1, the bolster plate 314 of FIG. 3, the bolster plate 506 of FIG. 5, the bolster plate 804 of FIG. 8 and/or the bolster plate 906 of FIG. 9. The bolster plate 1004 may include an aperture 1006 through which a connector assembly 1012 may pass to couple to a CPU package 1016. The connector assembly may include one or more of the features of the connector assembly 112 of FIG. 1, the connector assembly 202 of FIG. 2, the connector assembly 300 of FIG. 3, the mating connector assembly 512 of FIG. 5, the connector assembly 602 of FIG. 6, and/or the connector assembly 908 of FIG. 9.

The circuit board 1008 may include one or more of the features of the circuit board 104 of FIG. 1, the circuit board 310 of FIG. 3, the circuit board 504 of FIG. 5, the circuit board 802 of FIG. 8 and/or the circuit board 904 of FIG. 9. The CPU package 1016 may be mounted to the circuit board 1008. The CPU package 1016 may include one or more of the features of the CPU package 102 of FIG. 1, the CPU package 204 of FIG. 2, the CPU package 318 of FIG. 3, the CPU package 520 of FIG. 5, the CPU package 604 of FIG. 6 and/or the CPU package 912 of FIG. 9.

The vertical swing door-type mechanism 1000 may include a swing door 1002 rotationally mounted to the bolster plate 1004. The swing door 1002 may be mounted to the bolster plate 1004 by one or more connection points located above the aperture 1006. In some embodiments, the swing door 1002 may be rotationally mounted to the bolster plate 1004 by a hinge or hinge-style mechanism. The swing door 1002 may be configured to rotate around an imaginary line through the connection points in response to forces applied to the swing door 1002.

The vertical swing door-type mechanism 1000 may further include a spring 1010. The spring 1010 may contact the bolster plate 1004 and the swing door 1002, and may be configured to apply force to the swing door 1002 to maintain the swing door 1002 in the locked position absent external forces. The spring 1010 may include a torsional spring located at the mounting point of the swing door 1002 to the bolster plate 1004 and may be configured to apply a rotational force to the swing door 1002 around the point of rotation to maintain the swing door 1002 in the locked position in the absence of external forces.

The swing door 1002 may be configured to rotate about the connection points between a locked position and an unlocked position. In the locked position, the swing door 1002 may be located in a substantially downwards position and may be substantially parallel to the portion of the bolster plate 1004 to which the swing door 1002 is mounted. In the unlocked position, the swing door 1002 may be rotated upwards away from the bolster plate 1004 toward a direction perpendicular to the portion of the bolster plate 1004 to which the swing door 1002 is attached.

When the connector assembly 1012 is coupled to the CPU package 1016, the swing door 1002 may be rotated into the locked position and may contact a portion of the connector assembly 1012. The swing door 1002 may apply a force to the connector assembly 1012 in the direction toward the CPU package 1016, which may cause the connector assembly 1012 to be maintained, or substantially maintained, in a position relative to the CPU package 1016. The force applied by the swing door 1002 may be configured to withstand forces of 10 lbf in any direction while maintaining or substantially maintaining the position of the connector assembly 1012 relative to the CPU package 1016.

The connector assembly 1012 may include one or more protrusions 1014 extending from the connector assembly 1012 in a direction opposite the CPU package 1016. The swing door 1002 may include one or more apertures 1018. When in the locked position, the apertures 1018 of the swing door 1002 may engage with the protrusions 1014 of the connector assembly 1012. The engagement of the apertures 1018 with the protrusions 1014 may provide additional resistance to movement of the connector assembly 1012 when the swing door 1002 is in the locked position.

The swing door 1002 may be transitioned to or maintained in the unlocked position by applying a force to the swing door 1002 away from the bolster plate 1004. When the swing door 1002 is in the unlocked position, the swing door may no longer contact the connector assembly 1012 and the apertures 1018 may be disengaged from the protrusions 1014. In the unlocked position, the connector assembly 1012 can easily be coupled or uncoupled from the CPU package 1016 by applying a force toward or away, respectively, from the CPU package 1016 to the connector assembly 1012.

Figure 11:
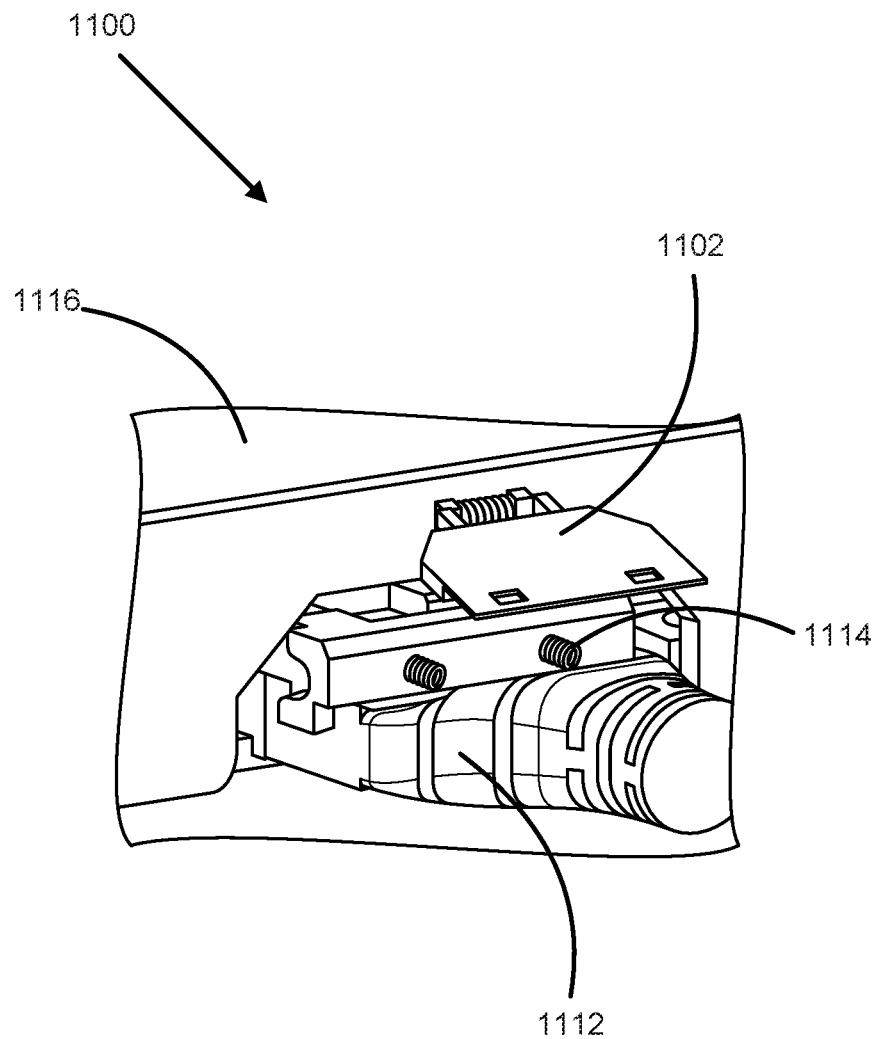
FIG. 11 illustrates another example vertical swing door-type locking mechanism with springs, according to various embodiments.

FIG. 11 illustrates another example vertical swing door-type locking mechanism 1100 with springs 1114, according to various embodiments. The vertical swing door-type locking mechanism 1100 may include one or more of the features of the vertical swing door-type locking mechanism 1000 and may perform one or more of the same operations as the vertical swing door-type locking mechanism 1000.

The vertical swing door-type locking mechanism 1100 may include one or more springs 1114 affixed to a connector assembly 1112. The springs 1114 may extend from the connector assembly 1112 in a direction opposite a CPU package 1116 when the connector assembly 1112 is coupled to the CPU package 1116. When a swing door 1102 is rotated into a locked position, the swing door 1102 may contact the springs 1114, thereby compressing the springs 1114 and applying a force to the connector assembly 1112 toward the CPU package 1116. The force applied by the swing door 1102 may maintain, or substantially maintain, a position of the connector assembly 1112 relative to the CPU package 1116. The swing door 1102 may withstand forces of 10 lbf in any direction while maintaining, or substantially maintaining, the position of the connector assembly 1112.

Figure 12:
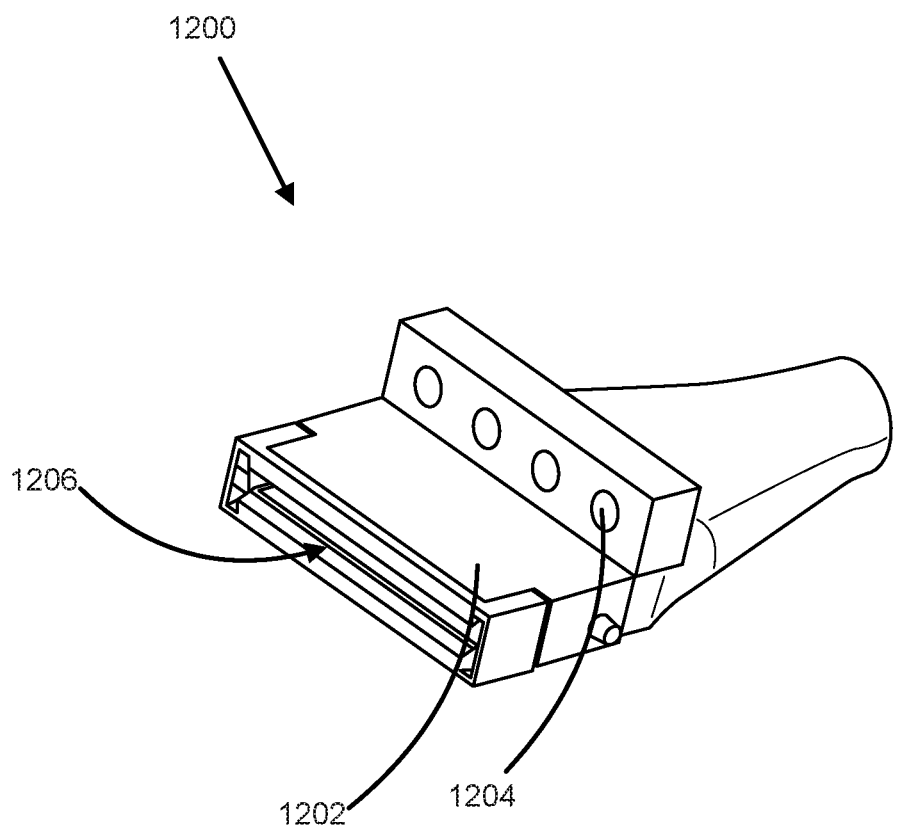
FIG. 12 illustrates an example connector assembly with magnetic retention, according to various embodiments.

FIG. 12 illustrates an example connector assembly 1200 with magnetic retention, according to various embodiments. The connector assembly 1200 may include one or more of the features of the connector assembly 112 of FIG. 1, the connector assembly 202 of FIG. 2, the connector assembly 300 of FIG. 3, the mating connector assembly 512 of FIG. 5, the connector assembly 602 of FIG. 6, the connector assembly 908 of FIG. 9, the connector assembly 1012 of FIG. 10 and/or the connector assembly 1112 of FIG. 11. The connector assembly may include a connector housing 1202. The connector housing 1202 may include one or more of the features of the connector housing 302 of FIG. 3.

The connector assembly 1200 may include one or more magnets 1204 mounted to and/or embedded within the connector housing 1202. The magnets 1204 may be mounted to and/or embedded within the connector housing 1202 at portion of the connector housing 1202 located above electrical contacts 1206 of the connector assembly 1200 to be coupled to a CPU package. Above the electrical contacts 1206 may be defined as being on a side of the electrical contacts 1206 opposite a circuit board when the connector assembly 1200 is coupled to the CPU package. The magnets 1204 may be mounted to and/or embedded within a portion of the connector housing 1202 that extends from a main body of the connector housing 1202 in a direction perpendicular to a top of the main body of the connector housing 1202. The main body of the connector housing 1202 may be intermediate a first end and a second end of the connector housing 1202, wherein the first end is to receive one or more wires and the second end is opposite the first end and provides access to the one or more electrical contacts 1206 corresponding to the one or more wires.

The magnets 1204 may be constructed of any type of magnetic material. In some embodiments, the magnets 1204 may be ceramic magnets. In some embodiments, the magnets 1204 may be constructed with magnetic material with strong magnetic properties.

Figure 13:
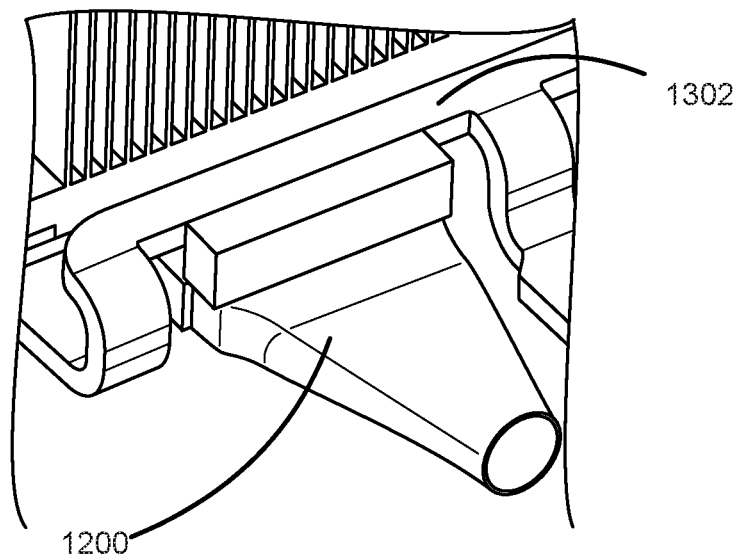
FIG. 13 illustrates the example connector assembly with magnetic retention of FIG. 12 coupled to a bolster plate, according to various embodiments.

FIG. 13 illustrates the example connector assembly 1200 of FIG. 12 with magnetic retention coupled to a bolster plate 1302, according to various embodiments. The connector assembly 1200 may be coupled to a CPU package, such as the CPU package 102 of FIG. 1, the CPU package 204 of FIG. 2, the CPU package 318 of FIG. 3, the CPU package 520 of FIG. 5, the CPU package 604 of FIG. 6, the CPU package 912 of FIG. 9, the CPU package 1016 of FIG. 10, or some combination thereof.

The bolster plate 1302 may include one or more of the features of the bolster plate 106 of FIG. 1, the bolster plate 314 of FIG. 3, the bolster plate 506 of FIG. 5, the bolster plate 804 of FIG. 8, the bolster plate 906 of FIG. 9 and/or the bolster plate 1004 of FIG. 10. The bolster plate 1302 may be a metal material, a metallic material, or some other material to which the magnets 1204, illustrated in FIG. 12, are attracted. The magnets 1204 may generate a magnetic force toward the bolster plate that maintains, or substantially maintains, a position of the connector assembly 1200 when the connector assembly 1200 is engaged with the CPU package. The magnetic force generated by the magnets 1204 may withstand a 10 lbf in any direction when maintaining, or substantially maintaining, the position of the connector assembly 1200.

Figure 14:
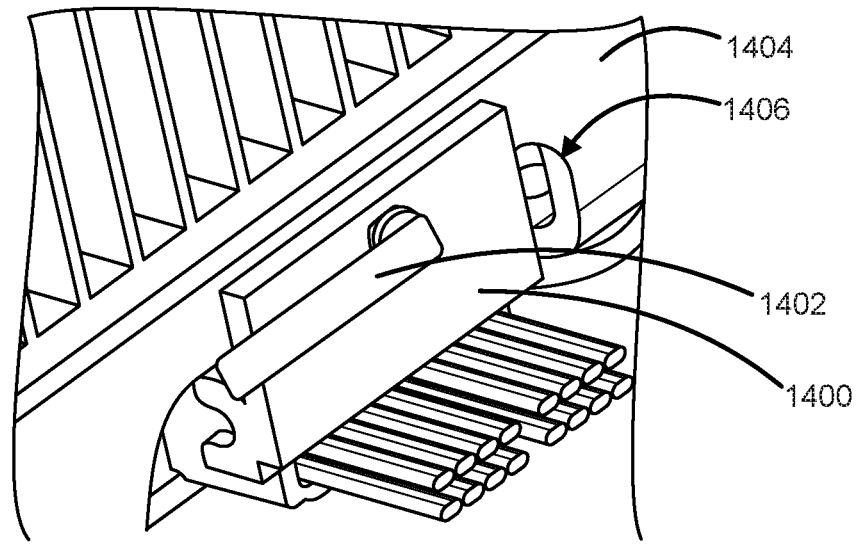
FIG. 14 illustrates an example connector assembly with a fastener locking mechanism, according to various embodiments.

FIG. 14 illustrates an example connecter assembly 1400 with a fastener locking mechanism 1402, according to various embodiments. The connector assembly 1400 may include one or more of the features of the connector assembly 112 of FIG. 1, the connector assembly 202 of FIG. 2, the connector assembly 300 of FIG. 3, the mating connector assembly 512 of FIG. 5, the connector assembly 602 of FIG. 6, the connector assembly 908 of FIG. 9, the connector assembly 1012 of FIG. 10, the connector assembly 1112 of FIG. 11 and/or the connector assembly 1200 of FIG. 12.

A portion of the connector assembly 1400 may extend through an aperture 1406 of a bolster plate 1404 to couple with a CPU package, such as the CPU package 102 of FIG. 1, the CPU package 204, the CPU package 318 of FIG. 3, the CPU package 520 of FIG. 5, the CPU package 604 of FIG. 6, the CPU package 912 of FIG. 9 and/or the CPU package 1016 of FIG. 10. A second portion of the connector assembly 1400 may be configured to contact a portion of the bolster plate 1404 when the connector assembly 1400 is coupled to the CPU package. The bolster plate 1404 may include one or more of the feature of the bolster plate 106 of FIG. 1, the bolster plate 314 of FIG. 3, the bolster plate 506 of FIG. 5, the bolster plate 804 of FIG. 8, the bolster plate 906 of FIG. 9, the bolster plate 1004 of FIG. 10 and/or the bolster plate 1302 of FIG. 13.

The connector assembly 1400 may include the fastener locking mechanism 1402 located in the second portion of the connector assembly 1400. The fastener locking mechanism 1402 may include a locking lever. The locking lever may be configured to rotate about a connection point with the second portion of the connector assembly 1400. In a first position of rotation about the connection point, the locking lever may affix the second portion of the connector assembly 1400 to the bolster plate 1404. In a second position of rotation about the connection point, the locking lever may not affix the second portion of the connector assembly 1400 to the bolster plate 1404 allowing the connector assembly 1400 to be easily moved.

When in the first position, when the locking lever affixes the second portion of the connector assembly 1400 to the bolster plate 1404, the locking lever may maintain, or substantially maintain, a position of the connector assembly 1400 relative to the CPU package. The locking lever may withstand of a force of 10 lbf in any direction while maintaining, or substantially maintaining, the position of the connector assembly 1400 to the CPU package.

In some embodiments, the bolster plate 1404 may include a second aperture corresponding to a location of the fastener locking mechanism 1402 when the connector assembly 1400 is coupled to the CPU package. The fastener locking mechanism 1402 may extend through the second aperture and may utilize the second aperture in affixing the second portion of connector assembly 1400 to the bolster plate 1404.

In some embodiments, the fastener locking mechanism 1402 may be a different type of fastener than the locking lever. In these embodiments, the fastener locking mechanism 1402 may include a screw, a bolt, a rivet, a pin, or some combination thereof.

Figure 15:
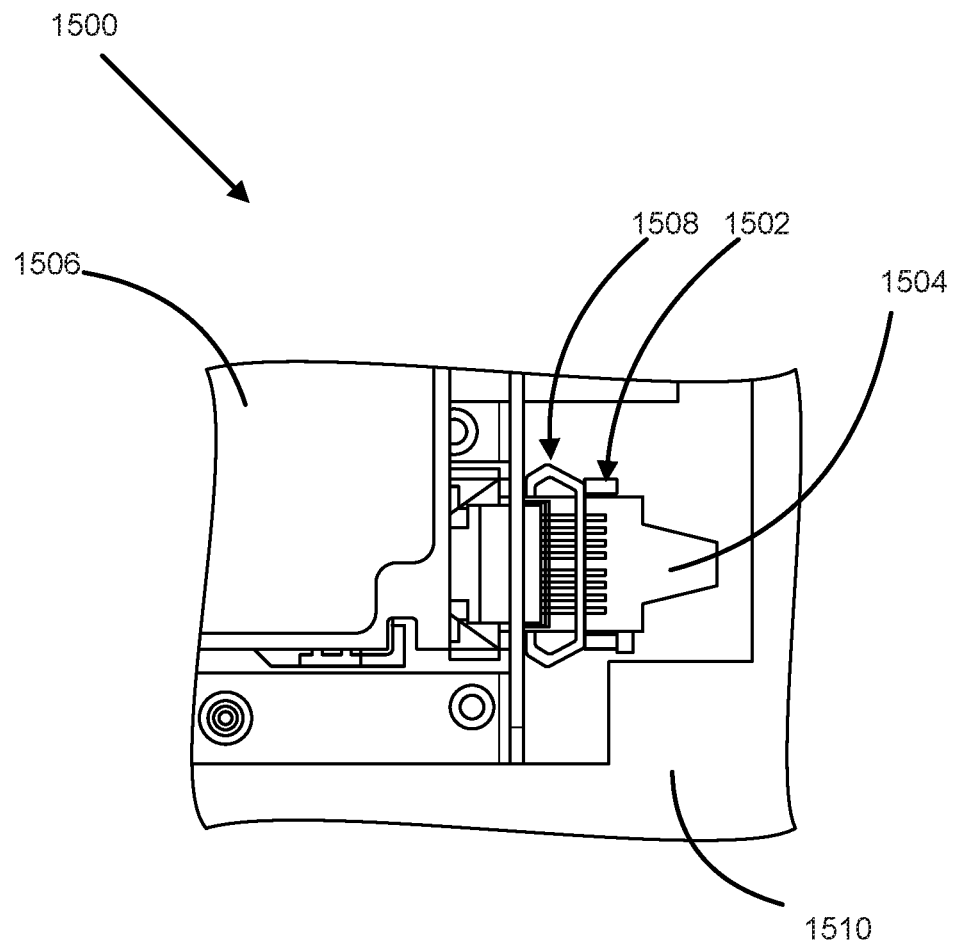
FIG. 15 illustrates an example locking mechanism with board-mounted features, according to various embodiments.

FIG. 15 illustrates an example locking configuration 1500 with board-mounted features 1502, according to various embodiments. The locking configuration 1500 may include a connector assembly 1504 that may be coupled to a CPU package 1506. The connector assembly 1504 may include one or more of the features of the connector assembly 112 of FIG. 1, the connector assembly 202 of FIG. 2, the connector assembly 300 of FIG. 3, the mating connector assembly 512 of FIG. 5, the connector assembly 602 of FIG. 6, the connector assembly 908 of FIG. 9, the connector assembly 1012 of FIG. 10, the connector assembly 1112 of FIG. 11, the connector assembly 1200 of FIG. 12 and/or the connector assembly 1400 of FIG. 14. The CPU package 1506 may include one or more of the features of the CPU package 102 of FIG. 1, the CPU package 204 of FIG. 2, the CPU package 318 of FIG. 3, the CPU package 520 of FIG. 5, the CPU package 604 of FIG. 6, the CPU package 912 of FIG. 9, the CPU package 1016 of FIG. 10 and/or the CPU package 1116 of FIG. 11.

The locking configuration 1500 may include one or more springs 1510. The springs 1510 may be affixed to the connector assembly 1504 near an end of the connector assembly 1504 where the connector assembly 1504 couples to the CPU package 1506 and may extend in a direction away from the end. The springs 1510 may be made of sheet metal and/or a wire and may be resilient to compress in response to a force being applied to the spring 1510 and return to an original state in response to the force being removed. The springs 1510 may include a single spring with two connection points on either side of the connector assembly 1504 with a body of the spring extending above the connector assembly 1504 and between the two connection points.

The locking configuration 1500 may include a circuit board 1510 with one or more board-mounted features 1502 mounted to the circuit board 1510. The circuit board 1510 may include one or more of the features of the circuit board 104 of FIG. 1, the circuit board 310 of FIG. 3, the circuit board 504 of FIG. 5, the circuit board 802 of FIG. 8, the circuit board 904 of FIG. 9 and/or the circuit board 1008 of FIG. 10. The board-mounted features 1502 may be mounted to the circuit board 1510 via apertures in the circuit board 1510 into which the board-mounted features 1502 may be installed. In some embodiments, the board-mounted features 1502 may be mounted to the circuit board 1510 using an adhesive and/or an adhesive layer.

The board-mounted features 1502 may include hooks, pins, standoffs, screws, rivets, some other fastener that may extend from the circuit board 1510 when mounted to the circuit board 1510, or some combination thereof. The board-mounted features 1502 may engage the springs 1510 when the connector assembly 1504 is coupled to the CPU package 1506. When engaged, the board-mounted features 1502 may cause the springs 1510 to compress, which in turn applies a force to the connector assembly 1504 in the direction of the CPU package 1506. The force applied by the compressed springs 1510 may maintain, or substantially maintain, a position of the connector assembly 1504 relative to the CPU package 1506. The compressed springs 1510 may withstand a force of 10 lbf when maintaining, or substantially maintaining, the position of the connector assembly 1504 relative to the CPU package 1506.

In some embodiments, the spring 1508 may be rotationally mounted to the connector assembly 1504 around the connection points with the connector assembly 1504. In these embodiments, the spring 1508 may be rotated into an engagement position with the board-mounted features 1502 where the spring 1508 is compressed by the board-mounted features 1502 when in engagement position, thereby applying the force to the connector assembly 1504. The spring 1508 may be rotated into an unengaged position where the spring 1508 is not engaged with the board-mounted features 1502 and the force is not applied to the connector assembly 1504.

In some embodiments, the board-mounted features 1502 may be removably mounted to the circuit board 1510. The board-mounted features 102 may be mounted while the connector assembly 1504 is coupled to the CPU package 1506, and may engage the springs 1508 and cause the springs 1508 to compress in response to the mounting of the board-mounted features 102. The board-mounted features 102 may then be removed from the circuit board 1510 thereby disengaging with the springs 1508 and uncompressing the springs 1508.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

Below is a list of non-exclusive examples of the disclosed subject matter.

Example 1 may include connector assembly for connection to a computer processing unit (CPU) package, comprising a connector housing to receive one or more wires into a first end of the connector housing and provide one or more electrical contacts, corresponding to the one or more wires, accessible from a second end of the connector housing, opposite the first end of the connector housing, wherein the one or more electrical contacts are to couple to the CPU package when the connector assembly is engaged with a mating connector assembly and a mounting handle affixed to a top of the connector housing, the top of the connector housing intermediate the first end of the connector housing and the second end of the connector housing, wherein the mounting handle includes a locking latch that extends from the mounting handle in a direction opposite from the connector housing, wherein the locking latch is to engage with a notch within the mating connector assembly that, when engaged, the locking latch is to provide a force to maintain coupling of the one or more electrical contacts with the CPU package when engaged with the mating connector assembly.

Example 2 may include the connector assembly of example 1 and/or some other examples herein, wherein the mounting handle is pliably affixed to the connector housing at one end of the mounting handle, and wherein the connector assembly further comprises a spring located intermediate the mounting handle and the connector housing, wherein the spring is to provide a separating force that causes the mounting handle to flex away from the connector housing about the one end of the mounting handle when a compressing force is not applied to the mounting handle in a direction from the mounting handle toward the connector housing.

Example 3 may include the connector assembly of example 2 and/or some other examples herein, wherein the separating force is to cause the locking latch to engage with the notch within the mating connector assembly when the connector assembly is engaged with the mating connector assembly.

Example 4 may include the connector assembly of example 1 and/or some other examples herein, wherein the mounting handle includes a resilient material, wherein the mounting handle is affixed to the connector housing at one end of the mounting handle at a non-zero angle to the connector housing, wherein the mounting handle is to flex around the one end of the mounting handle in response to a compressing force applied to the mounting handle in a direction toward the connector housing, and wherein a portion of the mounting handle, separate from the one end, is to contact the connector housing in response to the compressing force.

Example 5 may include the connector assembly of example 1 and/or some other examples herein, wherein the mounting handle is L-shaped, wherein the mounting handle is affixed to the connector housing at one end of the mounting handle, and wherein a second end of the mounting handle, opposite the first end of the mounting handle, extends away from the connector housing.

Example 6 may include the connector assembly of example 1 and/or some other examples herein, wherein the locking latch is formed from a same material as the mounting handle.

Example 7 may include the connector assembly of example 1 and/or some other examples herein, wherein the locking latch is to extend from the mounting handle at between a zero degree angle and a forty-five degree angle to the mounting handle.

Example 8 may include the connector assembly of example 1 and/or some other examples herein, wherein a bottom of the connector housing, opposite the top of the connector housing is to abut a circuit board on which the CPU package is mounted when the connector assembly is engaged with the mating connector assembly.

Example 9 may include the connector assembly of example 1 and/or some other examples herein, wherein the top of the connector housing, when the connector assembly is engaged with the mating connector assembly, is below a base of a heatsink mounted to the CPU package.

Example 10 may include the connector assembly of example 1 and/or some other examples herein, wherein the locking latch is rigid and capable of withstanding a force of 10 pound-force.

Example 11 may include a connector assembly to receive a mating connector assembly and maintain a connection between the mating connector assembly and a computer processing unit (CPU) package associated with the connector assembly, comprising a door frame insert to be mounted within an opening of a bolster plate mounted to a circuit board that includes the CPU package, wherein the bolster plate is to at least partially encircle the CPU package, and wherein the door frame insert includes a notch formed in an inner wall of the door frame insert opposite the circuit board, wherein the notch is to engage with a locking latch of the mating connector assembly and substantially maintain a position of the mating connector assembly when engaged with the locking latch.

Example 12 may include the connector assembly of example 11 and/or some other examples herein, wherein the connector assembly includes at least two springs mounted to an inside of the door frame insert, wherein a first spring of the at least two springs is mounted to a second inner wall of the door frame insert, wherein a second spring of the at least two springs is mounted to a third inner wall of the door frame insert, and wherein the inner wall with the notch is intermediate the second inner wall and the third inner wall.

Example 13 may include the connector assembly of example 11 and/or some other examples herein, wherein the door frame insert includes three inner walls, wherein two of the three inner walls extend perpendicularly from the circuit board and terminate at the inner wall with the notch.

Example 14 may include the connector assembly of example 11 and/or some other examples herein, wherein the inner wall with the notch is located at a distance from the circuit board that corresponds to a height of the mating connector assembly.

Example 15 may include the connector assembly of example 11 and/or some other examples herein, wherein a width, measured between a second inner wall of the door frame insert and a third inner wall of the door frame insert, corresponds to a width of the mating connector assembly, and wherein the inner wall with the notch is intermediate the second inner wall and the third inner wall.

Example 16 may include a bolster plate assembly to mount a pair of connector assemblies for connections to a computer processing unit (CPU) package associated with the bolster plate assembly, comprising a bolster plate to be affixed to a circuit board on which the CPU package is mounted, wherein the bolster plate at least partially encircles the CPU package, and wherein a portion of the bolster plate extends perpendicularly away from the circuit board on at least one side of the CPU package when affixed to the circuit board and a pair of apertures, formed in the portion of the bolster plate, to mount the pair of connector assemblies, wherein the pair of apertures are formed adjacent to each other along a first side of the CPU package.

Example 17 may include the bolster plate assembly of example 16 and/or some other examples herein, wherein the bolster plate is to encircle an entirety of the CPU package.

Example 18 may include the bolster plate assembly of example 16 and/or some other examples herein, wherein a lower edge of each of the pair of apertures is along a bend in the bolster plate for the portion of the bolster plate that extends perpendicularly away from the circuit board, wherein the bolster plate defines three inner walls to mount the pair of connector assemblies and the circuit board defines a fourth inner was to mount the pair of connector assemblies.

Example 19 may include the bolster plate assembly of example 16 and/or some other examples herein, wherein an inner edge of a first aperture of the pair of apertures is less than or equal to five millimeters from an inner edge of a second aperture of the pair of apertures, wherein the inner edge of the first aperture is a closest edge of the first aperture to the second aperture and the inner edge of the second aperture is a closest edge of the second aperture to the first aperture.

Example 20 may include the bolster plate assembly of example 16 and/or some other examples herein, wherein an outer edge of a first aperture of the pair of apertures is less than or equal to 50 millimeters from an outer edge of a second aperture of the pair of apertures, wherein the outer edge of the first aperture is a farthest edge of the first aperture from the second aperture and the outer edge of the second aperture is a farthest edge of the second aperture from the first aperture.

Example 21 may include the bolster plate assembly of example 16 and/or some other examples herein, wherein upper edges of each of the pair of apertures are below a base of a heatsink mounted to the CPU package when the bolster plate assembly is affixed to the circuit board, and wherein the upper edges are the edges of the pair of apertures farthest away from the circuit board when the bolster plate is affixed to the circuit board.

Example 22 may include a locking assembly to secure a connector assembly coupled to a computer processing unit (CPU) package, comprising a door frame insert to be affixed to a circuit board to which the CPU package is mounted and a castlegate-style door movably mounted through a portion of the door frame insert, wherein the portion of the door frame insert is opposite to the circuit board when the door frame insert is affixed to the circuit board, wherein the castlegate-style door is to move in directions perpendicular to the circuit board in response to forces applied to the castlegate-style door, wherein the castlegate-style door is to compress a spring of the connector assembly when the connector assembly is coupled to the CPU package and the castlegate-style door is in a down position.

Example 23 may include the locking assembly of example 22 and/or some other examples herein, wherein the castlegate-style door includes an aperture that extends from an edge of the castlegate-style door that contacts the circuit board when the castlegate-style door is in the down position, wherein a width of the aperture, measured from a first edge of the aperture that extends perpendicular to the circuit board to a second edge of the aperture that extends perpendicular to the circuit board, corresponds to a width of the connector assembly, wherein the first edge of the aperture is opposite from the second edge of the aperture.

Example 24 may include the locking assembly of example 22 and/or some other examples herein, wherein the castlegate-style door includes an aperture that extends from an edge of the castlegate-style door that contacts the circuit board when the castlegate-style door is in the down position, wherein a height of the aperture, measured from the edge of the castlegate-style door that contacts the circuit board when the castlegate-style door is in the down position to a top side of the aperture opposite the edge, corresponds to a height of the connector assembly.

Example 25 may include the locking assembly of example 22 and/or some other examples herein, wherein the castlegate-style door is L-shaped, wherein a first portion of the castlegate-style door, that extends through the door frame insert, extends in a direction perpendicular to the circuit board when the door frame insert is affixed to the circuit board, and wherein a second portion of the castlegate-style door extends in a direction parallel to the circuit board when the door frame insert is affixed to the circuit board.

Example 26 may include a locking assembly to secure a connector assembly coupled to a computer processing unit (CPU) package, comprising a bolster plate affixed to a circuit board to which the CPU package is mounted, wherein at least a portion of the bolster plate extends perpendicularly from the circuit board and a swing door rotationally mounted to the bolster plate, wherein a portion of the swing door is to contact the connector assembly when the swing door is in a closed position and substantially maintain a position of the connector assembly when in the closed position, and wherein the portion of the swing door is to be out of contact with the connector assembly when the swing door is in an open position and allows the connector assembly to be uncoupled from the CPU package.

Example 27 may include the locking assembly of example 26 and/or some other examples herein, wherein the portion of the swing door to contact the connector assembly when the swing door is in the closed position includes a curved edge portion of the swing door shaped to receive a cam of the connector assembly when the swing door is in the closed position.

Example 28 may include the locking assembly of example 26 and/or some other examples herein, further comprising a spring attached to the swing door and the bolster plate, wherein the spring generates a force around a point of rotation of the swing door to the bolster plate, wherein the force is to maintain the swing door in the closed position absent other forces applied to the swing door.

Example 29 may include the locking assembly of example 28 and/or some other examples herein, wherein the spring includes a leaf spring attached at a first end to the swing door and at a second end to the bolster plate, wherein the leaf spring is to contract to apply the force to maintain the swing door in the closed position.

Example 30 may include the locking assembly of example 28 and/or some other examples herein, wherein the spring includes a torsional spring contacting the bolster plate and the swing door, wherein the force generated by the torsional spring is a rotational force around the point of rotation.

Example 31 may include the locking assembly of example 30 and/or some other examples herein, wherein the swing door includes one or more apertures to receive one or more protrusions on the connector assembly when the swing door is in the closed position, wherein the one or apertures further maintain the position of the connector assembly when the swing door is in the closed position.

Example 32 may include a connector assembly for connection to a computer processing unit (CPU) package, comprising a connector housing to receive one or more wires into a first end of the connector housing and provide one or more contacts, corresponding to the one or more wires, accessible from a second end of the connector housing, opposite the first end of the connector housing, wherein the one or more contacts are to couple to the CPU package when the connector assembly is engaged with the CPU package and one or more magnets mounted in the connector housing, the one or more magnets to abut a bolster plate when the connector assembly is engaged with the mating connector assembly, wherein the one or more magnets generate a magnetic force to the bolster plate that maintains a position of the connector assembly when engaged with the CPU package.

Example 33 may include the connector assembly of example 32 and/or some other examples herein, wherein the one or more magnets are mounted in a portion of the connector housing that extends from a main body of the connector housing in a direction perpendicular to a top of the main body of the connector housing, wherein the top of the main body of the connector housing is intermediate the first end of the connector housing and the second end of the connector housing.

Example 34 may include the connector assembly of example 32 and/or some other examples herein, wherein a height of the connector housing, measured from a top of the connector housing to a bottom of the connector housing opposite the top, is less than a distance between a circuit board and a base of a heat sink mounted to the CPU package, wherein the bottom of the connector housing is to abut the circuit board, to which the CPU package is mounted, when the connector assembly is connected to the CPU package.

Example 35 may include the connector assembly of example 32 and/or some other examples herein, wherein a width of the connector housing, measured from a first side of the connector housing to a second side of the connector housing, corresponds to amount of the one or more wires, and wherein the first side of the connector housing and the second side of the connector housing are both located intermediate to the first end of the connector housing and the second end of the connector housing.

What is claimed is:

1. A connector assembly to receive a mating connector assembly and maintain a connection between the mating connector assembly and a computer processing unit (CPU) package associated with the connector assembly, comprising:
    a door frame insert to be mounted within an opening of a bolster plate mounted to a circuit board that includes the CPU package,
    wherein the bolster plate is to at least partially encircle the CPU package, and affixed to a circuit board on which the CPU package is mounted, a portion of the bolster plate extending perpendicularly away from the circuit board on at least one side of the CPU package when affixed to the circuit board; and having a pair of apertures for mounting to the connector assembly, and the pair of apertures being formed adjacent to each other along a first side of the CPU package; and
    wherein the door frame insert includes:
        a notch formed in an inner wall of the door frame insert opposite the circuit board, wherein when the mating connector assembly and the computer processing unit (CPU) package connects, the notch engages with a locking latch of the mating connector assembly, with the engaged locking latch providing a force to maintain coupling of the CPU package with the mating connector assembly.

2. The connector assembly of claim 1, wherein the connector assembly includes at least two springs mounted to an inside of the door frame insert, wherein a first spring of the at least two springs is mounted to a second inner wall of the door frame insert, wherein a second spring of the at least two springs is mounted to a third inner wall of the door frame insert, and wherein the inner wall with the notch is intermediate the second inner wall and the third inner wall.

3. The connector assembly of claim 1, wherein the door frame insert includes three inner walls, wherein two of the three inner walls extend perpendicularly from the circuit board and terminate at the inner wall with the notch.

4. The connector assembly of claim 1, wherein the inner wall with the notch is located at a distance from the circuit board that corresponds to a height of the mating connector assembly.

5. The connector assembly of claim 1, wherein a width, measured between a second inner wall of the door frame insert and a third inner wall of the door frame insert, corresponds to a width of the mating connector assembly, and wherein the inner wall with the notch is intermediate the second inner wall and the third inner wall.

6. A bolster plate assembly to mount a pair of connector assemblies for connections to a computer processing unit (CPU) package associated with the bolster plate assembly, comprising:
    a bolster plate to be affixed to a circuit board on which the CPU package is mounted, wherein the bolster plate at least partially encircles the CPU package, and wherein a portion of the bolster plate extends perpendicularly away from the circuit board on at least one side of the CPU package when affixed to the circuit board; and
    a pair of apertures, formed in the portion of the bolster plate, to mount the pair of connector assemblies, wherein the pair of apertures are formed adjacent to each other along a first side of the CPU package.

7. The bolster plate assembly of claim 6, wherein the bolster plate is to encircle an entirety of the CPU package.

8. The bolster plate assembly of claim 6, wherein a lower edge of each of the pair of apertures is along a bend in the bolster plate for the portion of the bolster plate that extends perpendicularly away from the circuit board, wherein the bolster plate defines three inner walls to mount the pair of connector assemblies and the circuit board defines a fourth inner wall to mount the pair of connector assemblies.

9. The bolster plate assembly of claim 6, wherein an inner edge of a first aperture of the pair of apertures is less than or equal to five millimeters from an inner edge of a second aperture of the pair of apertures, wherein the inner edge of the first aperture is a closest edge of the first aperture to the second aperture and the inner edge of the second aperture is a closest edge of the second aperture to the first aperture.

10. The bolster plate assembly of claim 6, wherein an outer edge of a first aperture of the pair of apertures is less than or equal to 50 millimeters from an outer edge of a second aperture of the pair of apertures, wherein the outer edge of the first aperture is a farthest edge of the first aperture from the second aperture and the outer edge of the second aperture is a farthest edge of the second aperture from the first aperture.

11. The bolster plate assembly of claim 6, wherein upper edges of each of the pair of apertures are below a base of a heatsink mounted to the CPU package when the bolster plate assembly is affixed to the circuit board, and wherein the upper edges are the edges of the pair of apertures farthest away from the circuit board when the bolster plate is affixed to the circuit board.

* * * * *